United States Patent [19]

Nakamura et al.

[11] Patent Number: 5,770,261

[45] Date of Patent: Jun. 23, 1998

[54] METHOD OF MANUFACTURING COATED CUTTING TOOL AND COATED CUTTING TOOL MADE FROM

[75] Inventors: Eiji Nakamura, Saitama; Toshiaki Ueda; Takashi Yamada, both of Ibaragi-ken; Takatoshi Oshika, Saitama, all of Japan

[73] Assignee: Mitsubishi Materials Corporation, Tokyo, Japan

[21] Appl. No.: 781,236

[22] Filed: Jan. 10, 1997

[30] Foreign Application Priority Data

| | | | |
|---|---|---|---|
| Jan. 10, 1996 | [JP] | Japan | 8-002292 |
| Mar. 25, 1996 | [JP] | Japan | 8-068114 |
| Apr. 12, 1996 | [JP] | Japan | 8-091025 |
| Apr. 15, 1996 | [JP] | Japan | 8-092423 |
| Apr. 16, 1996 | [JP] | Japan | 8-093966 |
| Nov. 15, 1996 | [JP] | Japan | 8-304335 |
| Nov. 15, 1996 | [JP] | Japan | 8-304336 |

[51] Int. Cl.$^6$ .................................................. C23C 16/40
[52] U.S. Cl. ..................... 427/255; 427/255.1; 427/255.3
[58] Field of Search ............................ 427/255.1, 255.3, 427/255; 407/120; 51/295

[56] References Cited

U.S. PATENT DOCUMENTS

| | | | |
|---|---|---|---|
| 4,675,089 | 6/1987 | Lory et al. | 204/164 |
| 4,745,010 | 5/1988 | Sarin et al. | 427/255 |
| 4,943,450 | 7/1990 | Sarin | 427/255.2 |
| 5,545,490 | 8/1996 | Oshika | 428/701 |

FOREIGN PATENT DOCUMENTS

| | | |
|---|---|---|
| 59-162270 | 9/1984 | Japan . |
| 60-159171 | 8/1985 | Japan . |

*Primary Examiner*—Shrive Beck
*Assistant Examiner*—Timothy Meeks
*Attorney, Agent, or Firm*—Oblon, Spivak, McClelland, Maier & Neustadt, P.C.

[57] ABSTRACT

A method of preparing a coated cutting tool is provided involving formation of a hard coating layer including an aluminum oxide layer to an average layer thickness of 3–20 microns on the surface of a cutting tool substrate using chemical vapor deposition and/or physical vapor deposition, to give a coated cutting tool excellent in chipping resistance, where the aluminum oxide layer is formed from an inert gas type reaction gas containing aluminum chloride and nitrogen oxides, and optionally titanium tetrachloride, nitrogen and hydrogen, in an inert carrier gas.

17 Claims, No Drawings

METHOD OF MANUFACTURING COATED CUTTING TOOL AND COATED CUTTING TOOL MADE FROM

BACKGROUND OF THE INVENTION

1. Field of the Invention

The present invention relates to a method for manufacturing a coated cutting tool to provide a hard coating layer comprising an aluminum oxide overlayer and having a uniform layer thickness even at high thicknesses, as well as excellent adhesion to other layers of the cutting tool, wherein the tool exhibits excellent chipping resistance for extended periods of time in both continuous and intermittent cutting.

2. Discussion of the Background

Hard-material-coated sintered carbide cutting tools made of a cemented tungsten carbide-based substrate (hereinafter, referred to as a cemented carbide substrate), the surface of which is coated with a hard coating layer comprising an $Al_2O_3$ layer are known. For example, hard coating layers composed of an $Al_2O_3$ layer and one, two or more of a titanium carbide (TiC) layer, a titanium nitride (TiN) layer, a titanium carbonitride (TiCN) layer, a titanium oxide ($TiO_2$) layer, a titanium oxycarbide (TiCO) layer, a titanium oxynitride (TiNO) layer, and a titanium oxycarbonitride (TiCNO) layer deposited using chemical vapor deposition and/or physical vapor deposition to an average layer thickness of 3–20 microns are known.

Further, it is also known to form the $Al_2O_3$ layer of the coated cemented carbide cutting tool using a reaction gas having the following composition in vol % (hereinafter referred to as merely as %, unless otherwise specified): Aluminum trichloride ($AlCl_3$): 1–20%; Carbon dioxide ($CO_2$): 1–20% (optionally, carbon monoxide (CO) or hydrogen chloride (HCl): 1–30%) and Hydrogen: remainder, at a reaction temperature of 950°–1100° C. and an atmospheric pressure of 20–200 torr of hydrogen.

Recently, there has been a strong tendency towards providing automatic cutting operations and labor cost savings in factories. Accordingly it is required to prolong the usable life of coated tools. As one means for coping with this requirement, the thickness of the $Al_2O_3$ layer has been increased to provide improved oxidation resistance, thermal stability and high hardness among the hard coating layers constituting the tool. However when the $Al_2O_3$ layer is made thicker, relative to other parts of the hard coating layer, the layer thickness thereof is made locally uneven by the use of the above-noted conventional $Al_2O_3$ layer forming methods. As a result, not only is the layer thickness highly variable among the flank face, the rake face, and the cutting edge of the insert but also the adhesion (interlayer adhesion) of the $Al_2O_3$ layer with other constituting layers is lowered. Because of this, the cutting edge tends to chip when the tool is used in intermittent cutting of metals, such as steel or cast iron, and the usable life of the tool is spent in a relatively short period of time.

SUMMARY OF THE INVENTION

Accordingly, one object of the present invention is to provide a method for the preparation of an $Al_2O_3$ layer in a coating layer of a coated cemented carbide cutting tool that reduces chipping and provides longer tool lifetime in both continuous and intermittent cutting of metals.

A further object of the present invention is to provide a method for the preparation of an $Al_2O_3$ layer in a coating layer of a coated cemented carbide cutting tool that provides improved layer thickness consistency.

A further object of the present invention is to provide a method for the preparation of an $Al_2O_3$ layer in a coating layer of a coated cemented carbide cutting tool that provides improved interlayer adhesion.

These and other objects of the present invention have been satisfied by the discovery of a method for preparing a coated cutting tool comprising:

coating a surface of a substrate with a hard coating layer comprising an aluminum oxide layer, using chemical vapor deposition, physical vapor deposition or both, wherein the aluminum oxide layer is formed from a reaction gas comprising aluminum trichloride and nitrogen oxides in an inert gas as carrier gas.

DETAILED DESCRIPTION OF THE PREFERRED EMBODIMENTS

The present invention relates to a method for preparing a coated cutting tool comprising:

coating a surface of a substrate with a hard coating layer comprising an aluminum oxide layer, using chemical vapor deposition, physical vapor deposition or both, wherein the aluminum oxide layer is formed from a reaction gas comprising aluminum trichloride and nitrogen oxides in an inert gas as carrier gas.

The present inventors have made the following observations:

(A) In an $Al_2O_3$ layer formed using a conventional hydrogen atmosphere, $CO_2$ and hydrogen ($H_2$) as components constituting the reaction gas, the components react with each other according to the following reaction formula (1).

$$CO_2 + H_2 \rightarrow CO + H_2O \qquad (1)$$

The resultant $H_2O$ reacts with $AlCl_3$ according to the following reaction formula (2) so that $Al_2O_3$ is created by the hydrolysis of $AlCl_3$.

$$AlCl_3 + H_2O \rightarrow Al_2O_3 + HCl \qquad (2)$$

In this case, since the reaction based on the formula (2) has a significantly higher reaction rate compared with the reaction based on the formula (1), $H_2O$ created by the formula (1) is immediately reacted with $AlCl_3$ existing in the reaction atmosphere. Therefore, almost all of the $Al_2O_3$ is created in the gas phase and consequently the $Al_2O_3$ layer is formed by the deposition of $Al_2O_3$ nuclei onto the surface of substrate. Consequently, it is difficult to form $Al_2O_3$ layers having a uniform layer thickness on the flank face, the rake face of a cutting portion and the cutting edge where the flank face intersects the rake face even if, for example, a cutting insert is placed in the flow of the reaction gas in any state. This difficulty is also increased since the $Al_2O_3$ layers are affected by the flow of the reaction gas and the shape of the substrate. Thus there is great dispersion in the layer thickness.

(B) Based on observation (A) above, the present inventors concluded that when a layer is made by creating $Al_2O_3$ nuclei adjacent and as close as possible to the surface, the layer thickness thereof can be made uniform. Thus, the inventors have developed an inert gas type reaction gas which permits such layer formation. The present method uses this reaction gas having the following composition by volume:

$AlCl_3$: 0.5–10%

Nitrogen oxides (hereinafter, shown by $NO_x$): 1–30%
Inert gas as the carrier gas: remainder When the inert gas type reaction gas mentioned above is used, $NO_x$ is dissolved at the surface of substrate according to the following reaction formula (a) and O created by the reaction according to the formula (a) is adsorbed to that surface, thus, the above O reacts with $AlCl_3$ at that surface according to the following reaction formula (b).

$$NO_x \rightarrow N_2 + O \quad (a)$$

$$AlCl_3 + O \rightarrow Al_2O_3 + Cl_2 \quad (b)$$

Therefore, the layer is formed in a state where the $Al_2O_3$ nuclei are mainly formed at the surface of the substrate, instead of in the gas phase, and the deposited layer is not significantly affected by the flow of the reaction gas and the shape of the substrate. As a result, the resultant deposited layer has a very small amount of local dispersion even if it is formed into a thick layer and further the adhesion of the layer to the substrate is enhanced. In addition, since the deposited layer is mainly composed of $Al_2O_3$, that is, an aluminum oxide layer in which the content of the components constituting the reaction gas except Al and oxygen is 15% or less and preferably 10% or less, the deposited layer has oxidation resistance, thermal stability and high hardness similar to the characteristics provided with $Al_2O_3$.

(C) $TiCl_4$, $ZrCl_4$ and $HfCl_4$ gases additionally mixed with the reaction gas act as a catalyst for the reaction $NO_x \rightarrow N_2 + O$ (a)

Note, the aluminum oxide layer of the present invention is described herein as a crystalline/non-crystalline aluminum oxide compound layer in which the content of the components other than Al and O constituting the reaction gas is 15% or less.

The present invention relates to a method for preparing a coated tool by forming a hard coating layer comprising an aluminum oxide layer, preferably a hard coating layer having an average layer thickness of 3–20 microns and comprising the aluminum oxide layer and one, two or more of a TiC layer, a TiN layer, a TiCN layer, a $TiO_2$ layer, a TiCO layer, a TiNO layer, and a TiCNO layer. The aluminum oxide layer is formed on the surface of a substrate using chemical vapor deposition and/or physical vapor deposition from a reaction gas comprising $AlCl_3$ and $NO_x$ with an inert gas as carrier. The present method preferably forms the aluminum oxide layer constituting the hard coating layer as a relatively thick layer (compared to conventional $Al_2O_3$ layers) using an inert gas-type reaction gas having the following composition:
$AlCl_3$: 0.5–10%
$NO_x$: 1–30%
$TiCl_4$: 0–15%
$N_2$: 0–15%
$H_2$: 0–20%
with the proviso that when $TiCl_4$ is present in the reaction gas, the volume ratio of $Al_2O_3$:$TiCl_4$ is from 5 to 100; with the remainder of the reaction gas being an inert gas.

The present method provides a coated cutting tool in which the layer thickness of the $Al_2O_3$ layer is more uniform and has enhanced adhesion to provide excellent chipping resistance.

When the amount of $AlCl_3$ in the reaction gas is less than 0.5%, the formation of the aluminum oxide layer is slowed to a practically unacceptable level due to insufficient amounts of an Al source. When the amount exceeds 10%, since the Al source is excessively supplied, the crystallinity of the aluminum oxide layer (deposited layer) is lowered. Thus the amount is preferably set to 0.5–10%, more preferably to 2–7%.

When the amount of $NO_x$ in the reaction is less than 1%, the crystallinity of the deposited layer is lowered due to an insufficient supply of O relative to the amount of Al. When the amount of $NO_x$ exceeds 30%, there is too much dissolved O relative to the Al source, causing localized fluctuations in layer thickness due to the reaction:

$$AlCl_3 + O \rightarrow Al_2O_3 + Cl_2$$

Thus, the uniformity of the layer thickness is lowered. Accordingly, the amount is preferably set to 1–30%, more preferably to 5–20%.

$TiCl_4$ is an optional component of the reaction gas of the present method which can be used to accelerate the reaction of the formula (a) $NO_x \rightarrow N_2 + O$. When the amount of $TiCl_4$ is less than 0.01%, the progress of the reaction of the above formula (a) can be insufficient, thus causing the supply of O for the preparation of $Al_2O_3$ to be insufficient. Under such conditions, the $Al_2O_3$ cannot be formed at a practical speed and the thickness uniformity of the layer is damaged. When the amount of $TiCl_4$ exceeds 1%, a large amount of Ti exists in the reaction atmosphere causing the crystallinity of the deposited layer to be lowered. Thus, the $TiCl_4$ amount is preferably set to 0.01–1%, more preferably to 0.1–0.5%.

While $H_2$ is an optional component of the reaction gas of the present method which activates the reaction atmosphere, when the amount of $H_2$ is less than 0.5%, the reaction atmosphere can be difficult to activate to the desired high level. When the amount of $H_2$ exceeds 20%, the layer thickness of the deposited layer is made uneven. Thus, the amount of $H_2$ is preferably set to 0.5–20%, more preferably to 1–10%.

$N_2$ has a stabilizing effect on the reaction of formula (a) above. This stabilization presumably is caused by suppressing the mutual bonding of created O. When the amount of $N_2$ is less than 1%, this stabilization effect cannot be sufficiently maintained, while when the amount of $N_2$ exceeds 15%, there is a tendency that the speed of formation of the deposited layer is lowered. Thus, the amount of $N_2$ in the reaction is preferably set to 1–15%, more preferably to 4–10%.

When $TiCl_4$ is used as an optional component of the reaction gas, the ratios by volume of $AlCl_3$:$TiCl_4$ should be maintained to balance the crystallinity of the formed layer and the layer forming speed. When the volume ratio of $AlCl_3$:$TiCl_4$ is less than 5, the resulting ratio of Ti source to Al source in the reaction atmosphere is excessively increased, thus lowering the crystallinity of the deposited layer and the required layer characteristics cannot be provided in the aluminum oxide layer. When the ratio of $AlCl_3$:$TiCl_4$ exceeds 100, the ratio of Ti:Al in the reaction atmosphere is excessively decreased. This causes the $NO_x$ dissolving action carried out by Ti on the surface of the substrate to be greatly lowered, particularly at a reaction temperature equal to or less than 1000° C. Further, the O source for production of $Al_2O_3$ is then insufficient and the layer forming speed is lowered. Thus, when $TiCl_4$ is present in the reaction gas, the ratio of $AlCl_3$:$TiCl_4$ is set to 5–100, preferably to 10–100 and more preferably to 10–50.

The reaction temperature for the present process is preferably 850°–1150° C., more preferably 900°–1100° C. and the atmospheric pressure is preferably 20–200 torr, more preferably 40–100 torr. When the reaction temperature is less than 850° C., the crystallinity of the deposited layer tends to be lowered, whereas when the temperature exceeds 1150° C., the aluminum oxide layer is coarsened and wear resistance is lowered. In addition, when the atmospheric pressure is less than 20 torr, the reaction is slowed and the layer is not formed at a sufficiently desirable speed, whereas when the pressure exceeds 200 torr, the surface of the aluminum oxide layer is made irregular, causing the coating layer thickness to be uneven.

The average layer thickness of the hard coating layer is preferably set to 3–20 microns. When the layer thickness is less than 3 microns, the desired excellent wear resistance cannot be provided, whereas when the layer thickness exceeds 20 microns, the cutting edge is likely to break and chip.

The present method can be applied to other substrates besides cemented carbides, including, but not limited to $Al_2O_3$, AlN, $Si_3N_4$ or SiC based substrates and their combination type ceramics and TiC, TiN, TiCN based cermets which are stable under the conditions of the present method.

Further, the method can be used to provide a wide variety of coated cutting tools required for longer tool life, including but not limited to, cutting inserts, reamers, and end mills.

EXAMPLES

Having generally described this invention, a further understanding can be obtained by reference to certain specific examples which are provided herein for purposes of illustration only and are not intended to be limiting unless otherwise specified.

Example 1

The following powder materials were prepared: medium grain WC powder having an average grain size of 2.8 microns, rough grain WC powder having an average grain size of 4.9 microns, (Ti, W) C (TiC/WC in a 30/70 weight ratio) powder having an average grain size of 1.5 microns, (Ti, W) CN (TiC/TiN/WC in a 24/20/56 weight ratio) powder having an average grain size of 1.2 microns, (Ta, Nb) C (TaC/NbC in a 90/10 weight ratio) powder having an average grain size of 1.2 microns, and Co powder having an average grain size of 1.1 microns. These powder materials were blended to have the blended compositions shown in Table 1 and wet mixed in a ball mill for 72 hours and dried. Then, they were molded to green compacts having the shapes regulated by ISO/CNMG120408 (for cemented carbide substrates A–D) and ISO/SEEN42AFTN1 (for cemented carbide substrate E) by a press. The resultant green compacts were made into the cemented carbide substrates A–E by being subjected to vacuum sintering under the conditions also shown in Table 1, respectively.

The cemented carbide substrate B was held in an atmosphere of $CH_4$ gas at a gas pressure of 100 torr at 1,400° C. for one hour and then subjected to carburization while being gradually cooled. After the processing, a Co-enriched-zone having a maximum Co content of 15.9 wt% and a depth of 42 microns was formed on the surface of the substrate by removing carbon and Co attached to the surface of the cemented carbide substrate by acid and barrel grinding.

Each of the cemented carbide substrates A and D had a Co-enriched-zone having a maximum Co content of 9.1 wt% and a depth of 23 microns, whereas the remaining cemented carbide substrates C and E had no Co-enriched-zone formed thereon and had a uniform structure as a whole. Table 1 shows the internal hardness of cemented carbide substrates A–E. (Rockwell hardness: A scale). The edges of these cemented carbide substrates A–E were subjected to honing.

Next, reactions 1–15 of the present invention and conventional reactions 1–10 were performed and coated cemented carbide tools (hereinafter, coated cemented carbide tools corresponding to the respective methods are referred to as present coated cutting tools 1–15 and conventional coated cutting tools 1–10) were manufactured by forming hard coating layers having the compositions and target layer thicknesses (at the flank face) shown in Tables 4 and 5 using conventional chemical vapor deposition, under the conditions shown in Table 2 (1 -TiCN in Table 2 has a longitudinally-grown crystal structure as disclosed in Japanese Unexamined Patent Publication No. 6-8010 and p-TiCN in Table 2 has an ordinary grain-shaped crystal structure) and Table 3 ($Al_2O_3$ (a) –(n) in Table 3 show aluminum oxide layers and $Al_2O_3$ (o) shows an $Al_2O_3$ layer, which are also applicable to Tables 4 and 5).

As to each of the aluminum oxide layers and the $Al_2O_3$ layers (referred to collectively as $Al_2O_3$ layers in Tables 6 and 7) constituting the hard coating layers of the various resultant coated cemented carbide tools, the maximum layer thickness of the cutting edge where a flank face intersected a rake face was measured and further the layer thicknesses on the flank face and the rake face which were located 1 mm inward from the cutting edge were measured. Tables 6 and 7 show the results of the measurements.

The layer thicknesses of the layers constituting the hard coating layer, other than the aluminum oxide layer and the $Al_2O_3$ layer, had almost no local dispersion and exhibited almost the same values as the target layer thicknesses.

The elemental compositions of the aluminum oxide layer of the hard-material-coated cutting tools of the present invention and of the $Al_2O_3$ layer of the conventional hard-material-coated cutting tools were analyzed using an EPMA. For those tools having an outermost layer composed of TiN, the analysis was carried out after the removal of the TiN using aqueous hydrogen peroxide. Measurement was carried out by irradiating, with a circular electron beam having a diameter of 1 mm, on the center of a flank face for tools having a shape according to ISO/CNMG120408 and on the center of a rake face for tools having a shape according to ISO/SEEN42AFTN1.

As a result, the present coated cutting tools 1–15 contained (in wt %) Al: 47.6–49.8%, O: 37.7–45.8%, Ti: 4.4–10.9%, and Cl: 0.015–0.21%. Likewise, the conventional coated cutting tools 1–10 contained Al: 52.8–53.0%, O: 47.0–47.2%, Ti: 0.01–0.02%, and Cl: less than measurable limit.

For the purpose of evaluating chipping resistance, present coated cutting tools 1–3 and conventional coated cutting tools 1 and 2 were subjected to an intermittent cutting test of ductile cast iron under the following conditions to measure flank face wear.
Cutting material: square piece of JIS/FCD450
Cutting speed: 180 m/min.
Cutting depth: 2 mm
Feed rate: 0.3 mm/rev.
Cutting time: 15 minutes Present coated cutting tools 4–6 and conventional coated cutting tools 3 and 4 were subjected to a dry intermittent cutting test of alloy steel under the following conditions to measure flank face wear.
Cutting material: square piece of JIS/SCM440
Cutting speed: 180 m/min.
Cutting depth: 2 mm
Feed rate: 0.3 mm/rev.
Cutting time: 15 minutes Present coated cutting tools 7–9 and conventional coated cutting tools 5 and 6 were subjected to a dry intermittent cutting test of carbon steel under the following conditions to measure flank face wear.
Cutting material: square piece of JIS/S45C
Cutting speed: 180 m/min.
Cutting depth: 2 mm
Feed rate: 0.3 mm/rev.
Cutting time: 15 minutes Present coated cutting tools 10–12 and conventional coated cutting tools 7 and 8 were subjected to a dry intermittent cutting test of cast iron under the following conditions to measure flank face wear.
Cutting material: square piece of JIS/FC200
Cutting speed: 180 m/min.
Cutting depth: 2 mm
Feed rate: 0.3 mm/rev. Cutting time: 15 minutes Present coated cutting tools 13–15 and conventional coated cutting tools 9 and 10 were subjected to a dry milling cutting test (intermittent cutting) of alloy steel under the following conditions to measure flank face wear.
Cutting material: square piece of JIS/SNCM439 with a width of 100 mm and a length of 500 mm
Using condition: mounting of single tooth on cutter of 125 mm dia.
Rotation: 510 r.p.m.
Cutting speed: 200 m/min.
Cutting depth: 2 mm
Feed rate: 0.2 mm/tooth
Cutting time: 3 paths (cutting time/path: 5.3 minutes)
Tables 6 and 7 show the results of these measurements.

Example 2

Cemented carbide substrates A–E were prepared by the same method as used in Example 1. Next, reactions 16–30 of the present invention and conventional reactions 11–20 were performed and coated cemented carbide tools (hereinafter referred to as present coated cutting tools 16–30 and conventional coated cutting tools 11–20) were manufactured by forming hard coating layers having the compositions and target layer thicknesses (at the flank face) shown in Tables 9 and 10 using conventional chemical vapor deposition under the conditions shown in Table 2 and Table 8 ($Al_2O_3$ (a)–(n) in Table 8 show aluminum oxide layers and $Al_2O_3$ (o) shows an $Al_2O_3$ layer, which are also applicable to Tables 9 and 10).

As to each of the aluminum oxide layers and the $Al_2O_3$ layers (collectively referred to in Tables 11 and 12 as $Al_2O_3$ layers) constituting the hard coating layers of the various resultant coated cutting tools, the maximum layer thickness of the cutting edge where a flank face intersected a rake face was measured and further the layer thicknesses on the flank face and the rake face which were located 1 mm inward from the cutting edge were measured. Tables 11 and 12 show the results of the measurements.

The layer thicknesses of the layers constituting the hard coating layer, other than the aluminum oxide layer and the $Al_2O_3$ layer, had almost no local dispersion and exhibited almost the same values as target layer thicknesses.

The elemental composition of the aluminum oxide layer of the present coated cutting tools and that of the $Al_2O_3$ layer of the conventional coated cutting tools were analyzed using an EPMA. Elemental analysis was carried out according to the same procedure used in Example 1.

As a result, present coated cutting tools 16–30 contained (in wt %) Al: 46.5–49.9%, O: 37.7–45.8%, Ti: 4.1–12.1%, and Cl: 0.019–0.23%. Likewise, conventional coated cutting tools 11–20 contained Al: 52.8–53.0%, O: 47.0–47.2%, Ti: 0.01–0.02%, and Cl: less than measurable limit.

For the purpose of evaluating chipping resistance, present coated cutting tools 16–18 and conventional coated cutting tools 11 and 12 were subjected to an intermittent cutting test of ductile cast iron under the following conditions to measure flank face wear.
Cutting material: square piece of JIS/FCD450
Cutting speed: 180 m/min.
Cutting depth: 2.5 mm
Feed rate: 0.3 mm/rev.
Cutting time: 15 minutes Present coated cutting tools 19–21 and conventional coated cutting tools 13 and 14 were subjected to a dry intermittent cutting test of alloy steel under the following conditions to measure flank face wear.
Cutting material: square piece of JIS/SCM440
Cutting speed: 180 m/min.
Cutting depth: 2.5 mm
Feed rate: 0.3 mm/rev.
Cutting time: 15 minutes Present coated cutting tools 22–24 and conventional coated cutting tools 15 and 16 were subjected to a dry intermittent cutting test of carbon steel under the following conditions to measure flank face wear.
Cutting material: square piece of JIS/S45C
Cutting speed: 180 m/min.
Cutting depth: 2.5 mm
Feed rate: 0.3 mm/rev.
Cutting time: 15 minutes Present coated cutting tools 25–27 and conventional coated cutting tools 17 and 18 were subjected to a dry intermittent cutting test of cast iron under the following conditions to measure flank face wear.
Cutting material: square piece of JIS/FC200
Cutting speed: 180 m/min.
Cutting depth: 2.5 mm
Feed rate: 0.3 mm/rev.
Cutting time: 15 minutes Present coated cutting tools 28–30 and conventional coated cutting tools 19 and 20 were subjected to a dry milling cutting test (intermittent cutting) of alloy steel under the following conditions to measure flank face wear.
Cutting material: square piece of JIS/SCM440 with a width of 100 mm and a length of 500 mm
Using condition: mounting of single tooth on cutter of 125 mm dia.
Rotation: 510 r.p.m.
Cutting speed: 200 m/min.
Cutting depth: 2 mm
Feed rate: 0.2 mm/tooth
Cutting time: 3 paths (cutting time/path: 5.3 minutes)
Tables 11 and 12 show the results of these measurements.

Example 3

Cemented carbide substrates A–E were prepared by the same method as used in Example 1. Next, reactions 31–44 of the present invention and conventional methods 21–30 were performed, and coated cemented carbide tools (hereinafter, referred to as present coated cutting tools 31–44 and conventional coating cutting tools 21–30) were manufactured by forming hard coating layers having the compositions and target layer thicknesses (at the flank face) shown in Tables 14 and 15 using conventional chemical vapor deposition, under the conditions shown in Table 2 and Table 13 ($Al_2O_3$ (a)–(l) in Table 13 show aluminum oxide layers and $Al_2O_3$ (m) shows an $Al_2O_3$ layer, which are also applicable to Tables 14 and 15 likewise).

With respect to each of the aluminum oxide layers and the $Al_2O_3$ layers (referred to collectively in Tables 16 and 17 as $Al_2O_3$ layers) constituting the hard coating layers of the various resultant coated cutting tools, the maximum layer thickness of the cutting edge where a flank face intersected a rake face was measured and further the layer thicknesses on the flank face and the rake face which were located 1 mm inward from the cutting edge were measured. Tables 16 and 17 show the results of the measurements.

The layer thicknesses of the layers of the hard coated layer, other than the aluminum oxide layer and the $Al_2O_3$ layer, had almost no local dispersion and exhibited almost the same values as target layer thicknesses.

The elemental composition of the aluminum oxide layer of the present coated cutting tools and that of the $Al_2O_3$ layer of the conventional coated cutting tools were analyzed using an EPMA. Elemental analysis was carried out using the same procedure as in Example 1.

The present coated cutting tools 31–44 contained (in wt %) Al: 46.6–47.8%, O: 35.5–42.8%, Ti: 6.5–14.3%, and Cl: 0.11–0.46%. Likewise, conventional coated cutting tools 21–30 contained Al: 52.8–53.0%, O: 47.0–47.2%, Ti: 0.01–0.02%, and Cl: less than measurable limit.

For the purpose of evaluating chipping resistance, present coated cutting tools 31–36 and conventional coated cutting tools 21 and 22 were subjected to an intermittent cutting test of mild steel under the following conditions to measure the flank face wear.
Cutting material: square piece of mild steel
Cutting speed: 220 m/min.
Cutting depth: 1.5 mm
Feed rate: 0.18 mm/rev.
Cutting time: 20 minutes Present coated cutting tools 37–38 and conventional coated cutting tools 23 and 24 were subjected to a dry intermittent cutting test of ductile cast iron under the following conditions to measure the flank face wear.
Cutting material: square piece of JIS/FCD450
Cutting speed: 150 m/min.
Cutting depth: 2 mm
Feed rate: 0.3 mm/rev.
Cutting time: 15 minutes Present coated cutting tools 39 and 40 and conventional coated cutting tools 25 and 26 were subjected to a dry intermittent cutting test of alloy steel under the following conditions to measure flank face wear.
Cutting material: square piece of JIS/SNC/N439
Cutting speed: 150 m/min.
Cutting depth: 2 mm
Feed rate: 0.3 mm/rev.
Cutting time: 15 minutes Present coated cutting tools 41 and 42 and conventional coated cutting tools 27 and 28 were subjected to a dry intermittent cutting test of carbon steel under the following conditions to measure flank face wear.
Cutting material: square piece of JIS/S45C
Cutting speed: 150 m/min.
Cutting depth: 2 mm
Feed rate: 0.3 mm/rev.
Cutting time: 15 minutes Present coated cutting tools 43 and 44 and conventional coated cutting tools 29 and 30 were subjected to a dry milling cutting test (intermittent cutting) of mild steel under the following conditions to measure flank face wear.
Cutting material: square piece of mild steel with a width of 100 mm and a length of 500 mm
Using condition: mounting of single tooth on cutter of 125 mm dia.
Rotation: 600 r.p.m.
Cutting speed: 280 m/min.
Cutting depth: 2 mm
Feed rate: 0.24 mm/tooth
Cutting time: 7 paths (cutting time/path: 3.6 minutes) Tables 16 and 17 show the result of these measurements.

Example 4

Cemented carbide substrates A–E were prepared by the same method as used in Example 1. Next, reactions 46–60 (45 lacked) of the present invention and conventional reactions 31–40 were performed, and coated cemented carbide tools (hereinafter, referred to as present coated cutting tools 46–60 and conventional coated cutting tools 31–40) were manufactured by forming hard coating layers having the compositions and target layer thicknesses (at the flank face) shown in Tables 19 and 20 using conventional chemical vapor deposition, under the conditions shown in Table 2 and Table 18 ($Al_2O_3$ (a)–(l) in Table 18 show aluminum oxide layers and $Al_2O_3$ (m) shows an $Al_2O_3$ layer, which are also applicable to Tables 19 and 20 likewise).

As to each of the aluminum oxide layers and the $Al_2O_3$ layers (collectively referred to in Tables 21 and 22 as $Al_2O_3$ layers) constituting the hard coating layers of the various resultant coated cutting tools, the maximum layer thickness of the cutting edge where a flank face intersected a rake face was measured and further the layer thicknesses on the flank face and the rake face which were located 1 mm inward from the cutting edge were measured. Tables 21 and 22 show the result of the measurements.

The layer thicknesses of the layers constituting the hard coating layer, other than the aluminum oxide layer and the $Al_2O_3$ layer, had almost no local dispersion and exhibited almost the same values as target layer thicknesses.

The elemental composition of the aluminum oxide layer of the present coated cutting tools and that of the $Al_2O_3$ layer of the conventional coated cutting tools were analyzed using an EPMA. Elemental analysis was carried out based on the same procedure as used in Example 1.

Present coated cutting tools 46–60 contained (in wt %) Al: 44.3–47.9%, O: 35.1–42.7%, Ti: 5.9–14.7%, and Cl: 0.14–0.41%. Likewise, conventional coated cutting tools 31–40 contained Al: 52.8–53.0%, 0: 47.0–47.2%, Ti: 0.01–0.02%, and Cl: less than measurable limit.

For the purpose of evaluating chipping resistance, present coated cutting tools 46–48 and conventional coated cutting tools 31 and 32 were subjected to an intermittent cutting test of ductile cast iron under the following conditions to measure flank face wear.
Cutting material: square piece of JIS/FCD450
Cutting speed: 180 m/min.
Cutting depth: 3 mm
Feed rate: 0.2 mm/rev.
Cutting time: 15 minutes Present coated cutting tools 49–51 and conventional coated cutting tools 33 and 34 were subjected to a dry intermittent cutting test of alloy steel under the following conditions to measure flank face wear.
Cutting material: square piece of JIS/SNCM439
Cutting speed: 180 m/min.
Cutting depth: 3 mm
Feed rate: 0.2 mm/rev.
Cutting time: 15 minutes Present coated cutting tools 52–54 and conventional coated cutting tools 35 and 36 were subjected to a dry intermittent cutting test of carbon steel under the following conditions to measure flank face wear.

Cutting material: square piece of JIS/S30C
Cutting speed: 180 n/min.
Cutting depth: 3 mm
Feed rate: 0.2 mm/rev.
Cutting time: 15 minutes Present coated cutting tools 55–57 and conventional coated cutting tools 37 and 38 were subjected to a dry intermittent cutting test of cast iron under the following conditions to measure flank face wear.
Cutting material: square piece of JIS/FC300
Cutting speed: 180 m/min.
Cutting depth: 3 mm
Feed rate: 0.2 mm/rev.
Cutting time: 15 minutes Present coated cutting tools 58–60 and conventional coated cutting tools 39 and 40 were subjected to a dry milling cutting test (intermittent cutting) of alloy steel under the following conditions to measure flank face wear.
Cutting material: square piece of JIS/SNCM439 with a width of 100 mm and a length of 500 mm
Using condition: mounting of single tooth on cutter of 125 mm dia.
Rotation: 510 r.p.m.
Cutting speed: 200 m/min.
Cutting depth: 2 mm
Feed rate: 0.2 mm/tooth
Cutting time: 3 paths (cutting time/path: 5.3 minutes) Tables 21 and, 22 show the results of these measurements.

Example 5

Cemented carbide substrates A–E were prepared by the same method as used in Example 1. Reactions 61–75 of the present invention and conventional methods 41–50 performed and coated cemented carbide tools (hereinafter, referred to as present coated cutting tools 61–75 and conventional coated cutting tools 41–50) were manufactured by forming hard coating layers having the compositions and target layer thicknesses (at the flank face) shown in Tables 24 and 25 using conventional chemical vapor deposition, under the conditions shown in Table 2 and Table 23 ($Al_2O3$ (a)–(m) in Table 23 show aluminum oxide layers and $Al_2O_3$ (n) shows an $Al_2O_3$ layer, which is also applicable to Tables 24 and 25 likewise).

As to each of the aluminum oxide layers and the $Al_2O_3$ layers (collectively referred to in Tables 26 and 27 as $Al_2O_3$ layers) constituting the hard coated layers of the various resultant coated cutting tools, the maximum layer thickness of the cutting edge where a flank face intersected a rake face was measured and further the layer thicknesses on the flank face and the rake face which were located 1 mm inward from the cutting edge were measured. Tables 26 and 27 show the results of the measurements.

The layer thicknesses of the layers constituting the hard coating layer, other than the aluminum oxide layer and the $Al_2O_3$ layer, had almost no local dispersion and exhibited almost the same values as target layer thicknesses.

The elemental composition of the aluminum oxide layer of the present coated cutting tools and that of the $Al_2O_3$ layer of the conventional coated cutting tools were analyzed using an EPMA. Elemental analysis was carried out based on the same procedure as Example 1.

Present coated cutting tools 61–75 contained (in wt %) Al: 52.8–53.1%, O: 46.5–46.9%, and Cl: 0.13–0.36%. Likewise, conventional coated cutting tools 41–50 contained Al: 52.8–53.0%, O: 47.0–47.2%, Ti: 0.01–0.02%, and Cl: less than measurable limit.

For the purpose of evaluating chipping resistance, present coated cutting tools 61–63 and conventional coated cutting tools 41 and 42 were subjected to an intermittent cutting test of ductile cast iron under the following conditions to measure flank face wear.
Cutting material: square piece of JIS/FCD450
Cutting speed: 200 m/min.
Cutting depth: 1.5 mm
Feed rate: 0.35 mm/rev.
Cutting time: 15 minutes Present coated cutting tools 64–66 and conventional coated cutting tools 43 and 44 were subjected to a dry intermittent cutting test of alloy steel under the following conditions to measure flank face wear.
Cutting material: square piece of JIS/SCM440
Cutting speed: 200 m/min.
Cutting depth: 1.5 mm
Feed rate: 0.35 mm/rev.
Cutting time: 15 minutes Present coated cutting tools 67–69 and conventional coated cutting tools 45 and 46 were subjected to a dry intermittent cutting test of carbon steel under the following conditions to measure flank face wear.
Cutting material: square piece of JIS/S45C
Cutting speed: 200 m/min.
Cutting depth: 1.5 mm
Feed rate: 0.35 mm/rev.
Cutting time: 15 minutes Present coated cutting tools 70–72 and conventional coated cutting tools 47 and 48 were subjected to a dry intermittent cutting test of cast iron under the following conditions to measure flank face wear.
Cutting material: square piece of JIS/FC200
Cutting speed: 200 m/min.
Cutting depth: 1.5 mm
Feed rate: 0.35 mm/rev.
Cutting time: 15 minutes Present coated cutting tools 73–75 and conventional coated cutting tools 49 and 50 were subjected to a dry milling cutting test (intermittent cutting) of alloy steel under the following conditions to measure flank face wear.
Cutting material: square piece of JIS/SNCM439 with a width of 100 mm and a length of 500 mm
Using condition: mounting of single tooth on cutter of 125 mm dia.
Rotation: 380 r.p.m.
Cutting speed: 150 m/min.
Cutting depth: 2 mm
Feed rate: 0.25 mm/tooth
Cutting time: 2 paths (cutting time/path: 5.5 minutes) Tables 26 and 27 show the results of these measurements.

Example 6

Cemented carbide substrates A–E were prepared by the same method as used in Example 1. Reactions 76–85 of the present invention and conventional reactions 51–60 were performed and coated cemented carbide tools (hereinafter, referred to as the present coated cutting tools 76–85 and conventional coated cutting tools 51–60) were manufactured by forming hard coating layers having the compositions and target layer thicknesses (at the flank face) shown in Tables 29 and 30 using conventional chemical vapor deposition device, under the conditions shown in Table 2 and Table 28 ($Al_2O_3$ (a)–(i) in Table 28 show aluminum oxide layers and $Al_2O_3$ (j) shows an $Al_2O_3$ layer, which is also applicable to Tables 29 and 30).

As to each of the aluminum oxide layers and the $Al_2O_3$ layers (collectively referred to in Tables 31 and 32 as $Al_2O_3$ layers) constituting the hard coating layers of the various resultant coated cutting tools, the maximum layer thickness of the cutting edge where a flank face intersected a rake face was measured and further the layer thicknesses on the flank face and the rake face which were located 1 mm inward from the cutting edge were measured. Tables 31 and 32 show the results of the measurements.

The layer thicknesses of the layers constituting the hard coating layer, other than the aluminum oxide layer and the $Al_2O_3$ layer, had almost no local dispersion and exhibited almost the same values as target layer thicknesses.

The elemental composition constituting the aluminum oxide layer of the present coated cutting tools and that of the $Al_2O_3$ layer of the conventional coated cutting tools were analyzed using an EPMA. Elemental analysis was carried out based on the same procedure used in Example 1.

Present coated cutting tools 76–85 contained (in wt %) Al: 52.9–53.1%, O: 46.4–46.7%, and Cl: 0.45–0.47%. Likewise, the conventional coated cutting tools 51–60 contained Al: 52.8–53.0%, O: 47.0–47.2%, Ti: 0.01–0.02%, and Cl: less than measurable limit.

For the purpose of evaluating chipping resistance, present coated cutting tools 76 and 77 and conventional coated cutting tools 51 and 52 were subjected to an intermittent cutting test of ductile cast iron under the following conditions to measure flank face wear.
Cutting material: square piece of JIS/FCD450
Cutting speed: 200 m/min.
Cutting depth: 1.5 mm
Feed rate: 0.3 mm/rev.
Cutting time: 15 minutes Present coated cutting tools 78 and 79 and conventional coated cutting tools 53 and 54 were subjected to a dry intermittent cutting test of alloy steel under the following conditions to measure flank face wear.
Cutting material: square piece of JIS/SCM440
Cutting speed: 200 m/min.
Cutting depth: 1.5 mm
Feed rate: 0.3 mm/rev.
Cutting time: 15 minutes Present coated cutting tools 80 and 81 and conventional coated cutting tools 55 and 56 were subjected to a dry intermittent cutting test of carbon steel under the following conditions to measure flank face wear.
Cutting material: square piece of JIS/S45C
Cutting speed: 200 m/min.
Cutting depth: 1.5 mm
Feed rate: 0.3 mm/rev.
Cutting time: 15 minutes Present coated cutting tools 82 and 83 and conventional coated cutting tools 57 and 58 were subjected to a dry intermittent cutting test of cast iron under the following conditions to measure flank face wear.
Cutting material: square piece of JIS/FC200
Cutting speed: 200 m/min.
Cutting depth: 1.5 mm
Feed rate: 0.3 mm/rev.
Cutting time: 15 minutes Present coated cutting tools of the present invention 84 and 85 and conventional coated cutting tools 59 and 60 were subjected to a dry milling cutting test (intermittent cutting) of alloy steel under the following conditions to measure flank face wear.
Cutting material: square piece of JIS/SNCM439 with a width of 100 mm and a length of 500 mm
Using condition: mounting of single tooth on cutter of 125 mm dia.
Rotation: 380 r.p.m.
Cutting speed: 150 m/min.
Cutting depth: 2 mm
Feed rate: 0.2 mm/tooth
Cutting time: 2 paths (cutting time/path: 7 minutes)

Tables 31 and 32 show the result of these measurements.

TABLE 1

| | | Blended Composition (wt %) | | | | | Sintering Conditions | | |
| | | | | | | | Pressure | Temperature | Holding | Internal Hard- |
| Type | | Co | (Ti,W)C | (Ti,W)CN | (Ta,Nb)C | WC | (torr) | (°C.) | Time (hr) | ness (HRA) |
|---|---|---|---|---|---|---|---|---|---|---|
| Cemented Carbide Substrate | A | 6.3 | — | 6 | 4.1 | Remainder (Medium) | 0.10 | 1380 | 1 | 90.3 |
| | B | 5.3 | 5.2 | — | 5.1 | Remainder (Medium) | 0.05 | 1450 | 1 | 90.9 |
| | C | 9.5 | 8.1 | — | 4.9 | Remainder (Medium) | 0.05 | 1380 | 1.5 | 89.9 |
| | D | 4.5 | — | 4.8 | 3.1 | Remainder (Medium) | 0.10 | 1410 | 1 | 91.4 |
| | E | 10.2 | — | — | 2.2 | Remainder (Rough) | 0.05 | 1380 | 1 | 89.7 |

TABLE 2

Hard Coating Layer Forming Conditions

| | | Reaction conditions | |
|---|---|---|---|
| Hard Coating Layer | Composition of Reaction Gas (Vol %) | Pressure (torr) | Temperature (°C.) |
| TiC | $TiCl_4$: 4%, $CH_4$: 9%, $H_2$: Remainder | 50 | 1020 |
| TiN (First layer) | $TiCl_4$: 4%, $N_2$: 30%, $H_2$: Remainder | 50 | 915 |
| TiN (Other layer) | $TiCl_4$: 4%, $N_2$: 35%, $H_2$: Remainder | 200 | 1025 |
| l-TiCN | $TiCl_4$: 4%, $CH_3$ CN: 1.2%, $N_2$: 30%, $H_2$: Remainder | 50 | 900 |

TABLE 2-continued

Hard Coating Layer Forming Conditions

| Hard Coating Layer | Composition of Reaction Gas (Vol %) | Pressure (torr) | Temperature (°C.) |
|---|---|---|---|
| p-TiCN | $TiCl_4$: 4%, $CH_4$: 8%, $N_2$: 35%, $H_2$: Remainder | 50 | 1025 |
| $TiO_2$ | $TiCl_4$: 4%, $CO_2$: 6%, $H_2$: Remainder | 80 | 1000 |
| TiCO | $TiCl_4$: 4%, CO: 9%, $H_2$: Remainder | 50 | 1000 |
| TiNO | $TiCl_4$: 4%, NO: 9%, $H_2$: Remainder | 50 | 1000 |
| TiCNO | $TiCl_4$: 4%, CO: 5%, $N_2$: 8%, $H_2$: Remainder | 50 | 1000 |

TABLE 3

Hard Coating Layer Forming Conditions

| Hard Coating Layer | Composition of Reaction Gas (Vol %) | | | | | | | | | Reaction Conditions | |
|---|---|---|---|---|---|---|---|---|---|---|---|
| | $AlCl_3$ | NO | $NO_2$ | $N_2O$ | $TiCl_4$ | $H_2$ | $AlCl_3/TiCl_4$ | Ar | He | Pressure (torr) | Temperature (°C.) |
| $Al_2O_3$(a) | 0.5 | 10 | — | — | 0.01 | 5 | 50 | Remainder | — | 50 | 950 |
| $Al_2O_3$(b) | 2 | 10 | — | — | 0.1 | 5 | 20 | Remainder | — | 50 | 950 |
| $Al_2O_3$(c) | 5 | 10 | — | — | 0.3 | 5 | 17 | Remainder | — | 50 | 950 |
| $Al_2O_3$(d) | 7 | 10 | — | — | 0.5 | 5 | 14 | Remainder | — | 50 | 950 |
| $Al_2O_3$(e) | 10 | 10 | — | — | 1 | 5 | 10 | Remainder | — | 50 | 950 |
| $Al_2O_3$(f) | 5 | 5 | — | — | 0.2 | 3 | 25 | Remainder | — | 50 | 950 |
| $Al_2O_3$(g) | 5 | 15 | — | — | 0.2 | 3 | 25 | Remainder | — | 50 | 950 |
| $Al_2O_3$(h) | 5 | 20 | — | — | 0.2 | 3 | 25 | Remainder | — | 50 | 950 |
| $Al_2O_3$(i) | 5 | — | 1 | — | 0.1 | 2 | 50 | — | Remainder | 50 | 950 |
| $Al_2O_3$(j) | 5 | — | — | 30 | 0.1 | 2 | 50 | — | Remainder | 50 | 950 |
| $Al_2O_3$(k) | 5 | 10 | — | — | 0.2 | 0.5 | 25 | Remainder | — | 20 | 1000 |
| $Al_2O_3$(l) | 5 | 10 | — | — | 0.2 | 1 | 25 | Remainder | — | 20 | 1000 |
| $Al_2O_3$(m) | 5 | 10 | — | — | 0.2 | 10 | 25 | Remainder | — | 100 | 930 |
| $Al_2O_3$(n) | 5 | 10 | — | — | 0.2 | 20 | 25 | Remainder | — | 100 | 900 |
| $Al_2O_3$(o) | $AlCl_3$: 5%, $CO_2$: 12%, $H_2$: Remainder | | | | | | | | | 100 | 1020 |

TABLE 4

| Type | Symbol of | | Hard coating Layer (Target Layer Thickness shown in Parenthesis) | | | | | |
|---|---|---|---|---|---|---|---|---|
| | | Substrate | First Layer | Second Layer | Third Layer | Fourth Layer | Fifth Layer | Sixth Layer |
| Method of Present Invention | 1 | A | TiN (0.3) | 1-TiCN (9) | TiCNO (0.2) | $Al_2O_3$ (a)(3) | TiN (0.3) | — |
| | 2 | A | TiN (0.3) | 1-TiCN (9) | TiCNO (0.2) | $Al_2O_3$ (b)(6) | TiN (0.3) | — |
| | 3 | A | TiN (0.3) | 1-TiCN (9) | TiCNO (0.2) | $Al_2O_3$ (c)(9) | TiN (0.3) | — |
| | 4 | B | p-TiCN (8) | $Al_2O_3$ (c)(5) | TiN (0.3) | — | — | — |
| | 5 | B | TiC (8) | TiCO (0.2) | $Al_3O_3$ (d)(5) | TiN (0.3) | — | — |
| | 6 | B | TiC (8) | TiNO (0.2) | $Al_2O_3$ (e)(5) | — | — | — |
| | 7 | C | TiC (2) | TiN (1) | p-TiCN (4) | $TiO_2$ (0.1) | $Al_2O_3$ (f)(2) | — |
| | 8 | C | TiC (2) | TiN (1) | p-TiCN (4) | TiNO (0.1) | $Al_2O_3$ (g)(4) | — |
| | 9 | C | TiC (2) | TiN (1) | p-TiCN (4) | TiCNO (0.1) | $Al_2O_3$ (h)(6) | — |
| | 10 | D | TiC (0.1) | TiN (0.2) | 1-TiCN (4) | TiCNO (0.1) | $Al_2O_3$ (i)(6) | TiN (0.2) |
| | 11 | D | TiC (0.1) | TiN (0.2) | 1-TiCN (4) | TiCNO (0.1) | $Al_2O_3$ (j)(9) | TiN (0.2) |
| | 12 | D | TiC (0.1) | TiN (0.2) | 1-TiCN (4) | TiCNO (0.1) | $Al_2O_3$ (k)(12) | TiN (0.2) |
| | 13 | E | TiC (0.5) | $Al_2O_3$ (1)(2.5) | — | — | — | — |
| | 14 | E | TiN (0.1) | i-TiCN (1) | p-TiCN (0.1) | $Al_2O_3$(m)(2) | TiN (0.1) | — |
| | 15 | E | p-TiN (0.5) | $Al_2O_3$ (n)(2) | TiN (0.3) | — | — | — |

TABLE 5

| Type | Symbol of | | Hard coating Layer (Target Layer Thickness shown in Parenthesis) | | | | | |
|---|---|---|---|---|---|---|---|---|
| | | Substrate | First Layer | Second Layer | Third Layer | Fourth Layer | Fifth Layer | Sixth Layer |
| Conventional Method | 1 | A | TiN (0.3) | 1-TiCN (9) | TiCNO (0.2) | $Al_2O_3$ (o)(6) | TiN (0.3) | — |
| | 2 | A | TiN (0.3) | 1-TiCN (9) | TiCNO (0.2) | $Al_2O_3$ (o)(9) | TiN (0.3) | — |
| | 3 | B | p-TiCN (8) | $Al_2O_3$ (o)(5) | TiN (0.3) | — | — | — |

TABLE 5-continued

| Type | Symbol of Substrate | First Layer | Second Layer | Third Layer | Fourth Layer | Fifth Layer | Sixth Layer |
|---|---|---|---|---|---|---|---|
| 4 | B | TiC (8) | TiNO (0.2) | $Al_2O_3$ (o)(5) | — | — | — |
| 5 | C | TiC (2) | TiN (1) | p-TiCN (4) | TiNO (0.1) | $Al_2O_3$ (o)(4) | — |
| 6 | C | TiC (2) | TiN (1) | p-TiCN (4) | TiCNO (0.1) | $Al_2O_3$ (o)(6) | — |
| 7 | D | TiC (0.1) | TiN (0.2) | l-TiCN (4) | TiCNO (0.1) | $Al_2O_3$ (o)(9) | TiN (0.2) |
| 8 | D | TiC (0.1) | TiN (0.2) | l-TiCN (4) | TiCNO (0.1) | $Al_2O_3$ (o)(12) | TiN (0.2) |
| 9 | E | TiC (0.5) | $Al_2O_3$ (o)(2.5) | — | — | — | — |
| 10 | E | TiN (0.1) | l-TiCN (1) | p-TiCN (0.1) | $Al_2O_3$ (o)(2) | TiN (0.1) | — |

TABLE 6

| Type | | $Al_2O_3$ Layer (Layer Thickness of Each Portion: μm) | | | Wear of Flank Face (mm) |
|---|---|---|---|---|---|
| | | Flank Face | Cutting Edge | Rake Face | |
| Hard-Material- Coated Cemented Carbide Cutting Tool of Present Invention | 1 | 3.0 | 3.5 | 2.8 | 0.21 |
| | 2 | 6.0 | 6.9 | 5.8 | 0.26 |
| | 3 | 9.0 | 10.4 | 8.5 | 0.27 |
| | 4 | 5.1 | 6.0 | 5.0 | 0.23 |
| | 5 | 5.0 | 5.7 | 4.6 | 0.23 |
| | 6 | 5.0 | 5.6 | 4.7 | 0.22 |
| | 7 | 2.0 | 2.3 | 1.9 | 0.20 |
| | 8 | 4.0 | 4.5 | 3.9 | 0.21 |
| | 9 | 5.9 | 7.0 | 5.6 | 0.22 |
| | 10 | 6.0 | 6.9 | 5.9 | 0.28 |
| | 11 | 9.0 | 10.5 | 8.6 | 0.30 |
| | 12 | 12.1 | 14.0 | 11.3 | 0.31 |
| | 13 | 2.5 | 2.9 | 2.4 | 0.19 |
| | 14 | 2.0 | 2.2 | 1.9 | 0.19 |
| | 15 | 2.0 | 2.3 | 2.0 | 0.20 |

TABLE 7

| Type | | $Al_2O_3$ Layer (Layer Thickness of Each Portion: μm) | | | Wear of Flank Face (mm) |
|---|---|---|---|---|---|
| | | Flank Face | Cutting Edge | Rake Face | |
| Conventional Hard- Material-Coated Cemented Carbide Cutting Tool | 1 | 6.0 | 10.1 | 2.6 | Usable Life Finished in 2.5 min. |
| | 2 | 8.8 | 15.1 | 3.9 | Usable Life Finished in 3.0 min. |
| | 3 | 4.8 | 10.0 | 2.2 | Usable Life Finished in 4.5 min. |
| | 4 | 4.9 | 9.1 | 2.5 | Usable Life Finished in 4.5 min. |
| | 5 | 3.9 | 6.9 | 2.0 | Usable Life Finished in 6.5 min. |
| | 6 | 6.0 | 10.3 | 3.1 | Usable Life Finished in 8.0 min. |
| | 7 | 8.7 | 15.1 | 4.1 | Usable Life Finished in 2.0 min. |
| | 8 | 11.5 | 20.4 | 4.9 | Usable Life Finished in 2.5 min. |
| | 9 | 2.5 | 4.1 | 1.3 | Usable Life Finished in 11.5 min. |
| | 10 | 2.0 | 3.9 | 1.2 | Usable Life Finished in 8.0 min. |

(Usable life is finished due to chipping.)

TABLE 8

| Hard Coating Layer | Hard Coating Layer Forming Conditions | | | | | | | | | | |
|---|---|---|---|---|---|---|---|---|---|---|---|
| | Composition of Reaction Gas (Vol %) | | | | | | | | | Reaction Conditions | |
| | $AlCl_3$ | NO | $NO_2$ | $N_2O$ | $TiCl_4$ | $H_2$ | $N_2$ | $AlCl_3/TiCl_4$ | Ar | He | Pressure (torr) | Temperature (°C.) |
| $Al_2O_3$(a) | 0.5 | 3 | — | — | 0.02 | 5 | 5 | 25 | Remainder | — | 50 | 960 |
| $Al_2O_3$(b) | 2 | 5 | — | — | 0.02 | 5 | 5 | 100 | Remainder | — | 50 | 960 |

TABLE 8-continued

| Hard Coating Layer | Composition of Reaction Gas (Vol %) | | | | | | | AlCl₃/ | | | Pressure | Temperature |
|---|---|---|---|---|---|---|---|---|---|---|---|---|
| | AlCl₃ | NO | NO₂ | N₂O | TiCl₄ | H₂ | N₂ | TiCl₄ | Ar | He | (torr) | (°C.) |
| Al₂O₃(c) | 5 | 10 | — | — | 0.1 | 5 | 5 | 50 | Remainder | — | 50 | 960 |
| Al₂O₃(d) | 7 | 15 | — | — | 0.1 | 5 | 5 | 70 | Remainder | — | 50 | 960 |
| Al₂O₃(e) | 10 | 20 | — | — | 1 | 5 | 5 | 10 | Remainder | — | 50 | 960 |
| Al₂O₃(f) | 3 | — | 1 | — | 0.3 | 5 | 5 | 10 | Remainder | — | 50 | 960 |
| Al₂O₃(g) | 3 | — | — | 30 | 0.3 | 5 | 5 | 10 | Remainder | — | 50 | 960 |
| Al₂O₃(h) | 3 | 10 | — | — | 0.2 | 0.5 | 7 | 15 | — | Remainder | 100 | 900 |
| Al₂O₃(i) | 3 | 10 | — | — | 0.2 | 1 | 7 | 15 | — | Remainder | 100 | 900 |
| Al₂O₃(j) | 3 | 10 | — | — | 0.2 | 10 | 7 | 15 | — | Remainder | 100 | 900 |
| Al₂O₃(k) | 3 | 10 | — | — | 0.2 | 20 | 7 | 15 | — | Remainder | 100 | 900 |
| Al₂O₃(l) | 3 | 15 | — | — | 0.05 | 10 | 1 | 60 | Remainder | — | 30 | 1000 |
| Al₂O₃(m) | 3 | 15 | — | — | 0.05 | 10 | 10 | 60 | Remainder | — | 30 | 1000 |
| Al₂O₃(n) | 3 | 15 | — | — | 0.05 | 10 | 15 | 60 | Remainder | — | 30 | 1000 |
| Al₂O₃(o) | AlCl₃: 5%, CO₂: 12%, H₂: Remainder | | | | | | | | | | 100 | 1020 |

TABLE 9

| | | | Hard Coating Layer (Target Layer Thickness shown in Parenthesis) | | | | |
|---|---|---|---|---|---|---|---|
| Type | | Symbol of Substrate | First Layer | Second Layer | Third Layer | Fourth Layer | Fifth Layer | Sixth Layer |
| Method of Present Invention | 16 | A | TiC (3) | TiN (3) | TiC (1) | TiCNO (0.1) | Al₂O₃ (a)(3) | TiN (0.2) |
| | 17 | A | TiN (0.3) | l-TiCN (6) | TiC (2) | TiCO (0.1) | Al₂O₃ (b)(3) | TiN (0.2) |
| | 18 | A | TiN (0.3) | l-TiCN (8) | TiCNO (0.1) | Al₂O₃ (c)(3) | TiN (0.2) | — |
| | 19 | B | TiN (0.3) | l-TiCN (8) | TiCNO (0.1) | Al₂O₃ (c)(5) | TiN (0.2) | — |
| | 20 | B | p-TiCN (8) | Al₂O₃ (d)(5) | TiN (0.2) | — | — | — |
| | 21 | B | p-TiCN (8) | TiNO (0.1) | Al₂O₃ (a)(5) | TiN (0.2) | — | — |
| | 22 | C | TiC (6) | Al₂O₃ (f)(4) | TiN (0.2) | — | — | — |
| | 23 | C | p-TiCN (6) | TiO₂ (0.1) | Al₂O₃ (g)(6) | TiN (0.2) | — | — |
| | 24 | C | TiN (0.3) | l-TiCN (6) | p-TiCN (0.1) | Al₂O₃ (h)(6) | — | — |
| | 25 | D | TiN (0.2) | l-TiCN (5) | TiCNO (0.1) | Al₂O₃ (i)(8) | TiN (0.2) | — |
| | 26 | D | p-TiCN (5) | TiCO (0.1) | Al₂O₃ (j)(8) | — | — | — |
| | 27 | D | TiC (3) | p-TiCN (1) | Al₂O₃ (k)(10) | — | — | — |
| | 28 | E | TiC (0.5) | TiN (1) | Al₂O₃ (l)(2) | TiN (0.1) | — | — |
| | 29 | E | TiC (0.5) | Al₂O₃ (m)(2.5) | — | — | — | — |
| | 30 | E | TiN (0.2) | l-TiCN (0.5) | TiCNO (0.1) | Al₂O₃ (n) (2) | TiN (0.2) | — |

TABLE 10

| | | | Hard Coating Layer (Target Layer Thickness shown in Parenthesis) | | | | |
|---|---|---|---|---|---|---|---|
| Type | | Symbol of Substrate | First Layer | Second Layer | Third Layer | Fourth Layer | Fifth Layer | Sixth Layer |
| Conventional Method | 11 | A | TiC (3) | TiN (3) | TiC (1) | TiCNO (0.1) | Al₂O₃ (o)(3) | TiN (0.2) |
| | 12 | A | TiN (0.3) | l-TiCN (8) | TiCNO (0.1) | Al₂O₃ (o)(3) | TiN (0.2) | — |
| | 13 | B | TiN (0.3) | l-TiCN (8) | TiCNO (0.1) | Al₂O₃ (o)(5) | TiN (0.2) | — |
| | 14 | B | p-TiCN (8) | Al₂O₃ (o)(5) | TiN (0.2) | — | — | — |
| | 15 | C | TiC (6) | Al₂O₃ (o) (4) | TiN (0.2) | — | — | — |
| | 16 | C | p-TiCN (6) | TiO₂ (0.1) | Al₂O₃ (o)(6) | TiN (0.2) | — | — |
| | 17 | D | p-TiCN (5) | TiCO (0.1) | Al₂O₃ (o)(8) | — | — | — |
| | 18 | D | TiC (3) | p-TiCN (1) | Al₂O₃ (o)(10) | — | — | — |
| | 19 | E | TiC (0.5) | Al₂O₃ (o)(2.5) | — | — | — | — |
| | 20 | E | TiN (0.2) | l-TiCN (0.5) | TiCNO (0.1) | Al₂O₃ (o)(2) | TiN (0.2) | — |

TABLE 11

| Type | | Al₂O₃ Layer (Layer Thickness of Each Portion: μm) | | | Wear of Flank Face (mm) |
|---|---|---|---|---|---|
| | | Flank Face | Cutting Edge | Rake Face | |
| Hard-Material-Coated Cemented Carbide Cutting Tool of Present Invention | 16 | 3.0 | 3.3 | 2.8 | 0.27 |
| | 17 | 3.0 | 3.4 | 2.7 | 0.23 |
| | 18 | 3.0 | 3.4 | 2.8 | 0.26 |
| | 19 | 4.9 | 5.7 | 4.6 | 0.26 |
| | 20 | 5.0 | 5.7 | 4.6 | 0.22 |
| | 21 | 5.0 | 5.7 | 4.8 | 0.27 |
| | 22 | 4.0 | 4.6 | 3.9 | 0.27 |
| | 23 | 6.1 | 6.9 | 5.7 | 0.27 |
| | 24 | 6.1 | 6.9 | 5.8 | 0.26 |
| | 25 | 8.1 | 9.3 | 7.5 | 0.25 |
| | 26 | 8.0 | 9.0 | 7.7 | 0.26 |
| | 27 | 10.0 | 11.5 | 9.4 | 0.29 |
| | 28 | 2.0 | 2.2 | 1.9 | 0.24 |
| | 29 | 2.5 | 3.0 | 2.4 | 0.26 |
| | 30 | 2.0 | 2.3 | 1.9 | 0.24 |

TABLE 12

| Type | | Al₂O₃ Layer (Layer Thickness of Each Portion: μm) | | | Wear of Flank Face (mm) |
|---|---|---|---|---|---|
| | | Flank Face | Cutting Edge | Rake Face | |
| Conventional Hard-Material-Coated Cement Carbide Cutting Tool | 11 | 3.0 | 4.6 | 1.5 | Usable Life Finished in 4.5 min. |
| | 12 | 3.0 | 4.5 | 1.3 | Usable Life Finished in 4.0 min. |
| | 13 | 4.8 | 8.2 | 2.4 | Usable Life Finished in 2.0 min. |
| | 14 | 4.9 | 8.0 | 3.0 | Usable Life Finished in 2.5 min. |
| | 15 | 3.9 | 7.7 | 2.1 | Usable Life Finished in 6.5 min. |
| | 16 | 6.0 | 10.3 | 2.4 | Usable Life Finished in 7.5 min. |
| | 17 | 7.8 | 14.1 | 4.0 | Usable Life Finished in 3.0 min. |
| | 18 | 9.8 | 18.9 | 4.4 | Usable Life Finished in 5.5 min. |
| | 19 | 2.5 | 4.2 | 1.2 | Usable Life Finished in 7.5 min. |
| | 20 | 1.9 | 3.4 | 0.9 | Usable Life Finished in 8.0 min. |

(Usable life is finished due to chipping.)

TABLE 13

| Hard Coating Layer | Hard Coating Layer Forming Conditions | | | | | | | | Reaction Conditions | |
|---|---|---|---|---|---|---|---|---|---|---|
| | Composition of Reaction Gas (Vol %) | | | | | | | | Pressure (torr) | Temperature (°C.) |
| | AlCl₃ | NO | NO₂ | N₂O | TiCl₄ | AlCl₃/TiCl₄ | Ar | He | | |
| Al₂O₃(a) | 0.5 | 1 | — | — | 0.01 | 50 | Remainder | — | 50 | 1000 |
| Al₂O₃(b) | 2 | 8 | — | — | 0.1 | 20 | Remainder | — | 50 | 1000 |
| Al₂O₃(c) | 5 | 15 | — | — | 0.3 | 17 | Remainder | — | 50 | 1000 |
| Al₂O₃(d) | 7 | 22 | — | — | 0.6 | 12 | Remainder | — | 50 | 1000 |
| Al₂O₃(e) | 10 | 30 | — | — | 1 | 10 | Remainder | — | 50 | 1000 |
| Al₂O₃(f) | 10 | — | 30 | — | 0.1 | 100 | Remainder | — | 50 | 1000 |
| Al₂O₃(g) | 5 | — | — | 30 | 0.1 | 50 | Remainder | — | 50 | 1000 |
| Al₂O₃(h) | 5 | 15 | — | — | 0.3 | 17 | — | Remainder | 50 | 1000 |
| Al₂O₃(i) | 5 | — | 15 | — | 0.3 | 17 | Remainder | — | 50 | 900 |
| Al₂O₃(j) | 5 | — | — | 15 | 0.3 | 17 | Remainder | — | 50 | 1100 |
| Al₂O₃(k) | 5 | 15 | — | — | 0.3 | 17 | Remainder | — | 20 | 1000 |
| Al₂O₃(l) | 5 | 15 | — | — | 0.3 | 17 | Remainder | — | 200 | 1000 |
| Al₂O₃(m) | AlCl₃: 5%, CO₂: 12%, H₂: Remainder | | | | | | | | 100 | 1020 |

TABLE 14

| Type | | Symbol of Substrate | Hard Coating Layer (Target Layer Thickness shown in Parenthesis) | | | | | | |
|---|---|---|---|---|---|---|---|---|---|
| | | | First Layer | Second Layer | Third Layer | Fourth Layer | Fifth Layer | Sixth Layer | Seventh Layer |
| Method of Present Invention | 31 | D | TiN (0.5) | 1-TiCN (4.5) | TiCNO (0.1) | Al₂O₃ (a)(6) | TiN (0.3) | — | — |
| | 32 | D | TiN (0.5) | 1-TiCN (4.5) | TiCNO (0.1) | Al₂O₃ (b)(6) | TiN (0.3) | — | — |
| | 33 | D | TiN (0.5) | 1-TiCN (4.5) | TiCNO (0.1) | Al₂O₃ (c)(6) | — | — | — |
| | 34 | D | TiN (0.5) | 1-TiCN (4.5) | TiCNO (0.1) | Al₂O₃ (c)(6) | TiN (0.3) | — | — |
| | 35 | D | TiN (0.5) | 1-TiCN (4.5) | TiCNO (0.1) | Al₂O₃ (d)(6) | TiN (0.3) | — | — |
| | 36 | D | TiN (0.5) | 1-TiCN (4.5) | TiCNO (0.1) | Al₂O₃ (e)(6) | TiN (0.3) | — | — |
| | 37 | A | TiN (0.5) | 1-TiCN (2) | TiC (2) | TiN (0.2) | Al₂O₃ (f)(8) | TiN (0.3) | — |
| | 38 | A | TiN (0.5) | 1-TiCN (2) | TiC (2) | TiO₂ (0.1) | Al₂O₃ (g)(8) | TiN (0.3) | — |
| | 39 | B | TiC (1) | p-TiCN (1.5) | TiC (1.5) | TiNO (0.1) | Al₂O₃ (h)(6) | — | — |
| | 40 | B | TiC (1) | p-TiCN (1.5) | TiC (1.5) | TiCO (0.1) | Al₂O₃ (i)(8) | — | — |
| | 41 | C | TiC (1) | p-TiCN (3) | TiCO (0.2) | Al₂O₃ (j)(10) | — | — | — |
| | 42 | C | TiC (1) | p-TiCN (0.5) | 1-TiCN (2.5) | TiC (0.5) | p-TiCN (0.2) | Al₂O₃ (k)(10) | TiN (0.3) |
| | 43 | E | TiN (0.5) | 1-TiCN (1) | TiNO (0.1) | Al₂O₃ (l)(1.5) | TiN (0.3) | — | — |
| | 44 | E | TiC (0.3) | TiN (0.3) | TiC (0.3) | TiO₂ (0.1) | Al₂O₃ (c)(2.5) | TiN (0.2) | — |

TABLE 15

| Type | | Symbol of Substrate | Hard Coating Layer (Target Layer Thickness shown in Parenthesis) | | | | | | |
|---|---|---|---|---|---|---|---|---|---|
| | | | First Layer | Second Layer | Third Layer | Fourth Layer | Fifth Layer | Sixth Layer | Seventh Layer |
| Conventional Method | 21 | D | TiN (0.5) | 1-TiCN (4.5) | TiCNO (0.1) | Al₂O₃ (m)(6) | — | — | — |
| | 22 | D | TiN (0.5) | 1-TiCN (4.5) | TiCNO (0.1) | Al₂O₃ (m)(6) | TiN (0.3) | — | — |
| | 23 | A | TiN (0.5) | 1-TiCN (2) | TiC (2) | TiN (0.2) | Al₂O₃ (m)(8) | TiN (0.3) | — |
| | 24 | A | TiN (0.5) | 1-TiCN (2) | TiC (2) | TiO₂ (0.2) | Al₂O₃ (m)(8) | TiN (0.3) | — |
| | 25 | B | TiC (1) | p-TiCN (1.5) | TiC (1.5) | TiNO (0.1) | Al₂O₃ (m)(8) | — | — |
| | 26 | B | TiC (1) | p-TiCN (1.5) | TiC (1.5) | TiCO (0.1) | Al₂O₃ (m)(8) | — | — |
| | 27 | C | TiC (1) | p-TiCN (3) | TiCO (0.2) | Al₂O₃ (m)(10) | — | — | — |
| | 28 | C | TiC (1) | p-TiCN (0.5) | 1-TiCN (2.5) | TiC (0.5) | p-TiCN (0.2) | Al₂O₃ (m)(10) | TiN (0.3) |
| | 29 | E | TiN (0.5) | 1-TiCN (1) | TiCO (0.1) | Al₂O₃ (m)(1.5) | TiN (0.3) | — | — |
| | 30 | E | TiC (0.3) | TiN (0.3) | TiC (0.3) | TiO₂ (0.1) | Al₂O₃ (m)(2.5) | TiN (0.2) | — |

TABLE 16

| | | Al₂O₃ Layer (Layer Thickness of Each Portion: $\mu$m) | | | Wear of |
|---|---|---|---|---|---|
| Type | | Flank Face | Cutting Edge | Rake Face | Flank Face (mm) |
| Hard-Material-Coated Cemented Carbide Cutting Tool of Present Invention | 31 | 5.9 | 7.0 | 5.4 | 0.19 |
| | 32 | 5.8 | 6.8 | 5.4 | 0.19 |
| | 33 | 6.1 | 6.9 | 6.0 | 0.18 |
| | 34 | 6.2 | 7.0 | 6.0 | 0.17 |
| | 35 | 6.2 | 7.3 | 6.0 | 0.17 |
| | 36 | 6.2 | 7.3 | 5.8 | 0.18 |
| | 37 | 8.2 | 9.5 | 7.7 | 0.26 |
| | 38 | 7.9 | 9.2 | 7.3 | 0.25 |
| | 39 | 8.0 | 9.1 | 7.6 | 0.30 |
| | 40 | 7.8 | 9.0 | 7.3 | 0.27 |
| | 41 | 10.2 | 12.0 | 9.6 | 0.21 |
| | 42 | 9.9 | 11.6 | 9.6 | 0.23 |
| | 43 | 1.5 | 1.8 | 1.5 | 0.20 |
| | 44 | 2.5 | 3.0 | 2.4 | 0.18 |

TABLE 17

| Type | | Flank Face | Cutting Edge | Rake Face | Wear of Flank Face (mm) |
|---|---|---|---|---|---|
| Conventional Hard- | 21 | 6.2 | 15.0 | 2.9 | Usable Life Finished in 1.5 min. |
| Material-Coated Cement | 22 | 6.0 | 14.5 | 2.8 | Usable Life Finished in 2.2 min. |
| Carbide Cutting Tool | 23 | 7.8 | 19.1 | 3.3 | Usable Life Finished in 7.0 min. |
| | 24 | 8.1 | 20.0 | 3.7 | Usable Life Finished in 5.8 min. |
| | 25 | 8.2 | 19.8 | 3.6 | Usable Life Finished in 9.0 min. |
| | 26 | 8.1 | 19.7 | 3.5 | Usable Life Finished in 6.5 min. |
| | 27 | 10.1 | 25.2 | 4.5 | Usable Life Finished in 11.2 min. |
| | 28 | 10.3 | 25.5 | 4.6 | Usable Life Finished in 11.0 min. |
| | 29 | 1.5 | 3.8 | 0.7 | Usable Life Finished in 13.2 min. |
| | 30 | 2.4 | 6.1 | 1.2 | Usable Life Finished in 12.7 min. |

Column header: $Al_2O_3$ Layer (Layer Thickness of Each Portion: $\mu$m)

(Usable life is finished due to chipping.)

TABLE 18

Hard Coating Layer Forming Conditions

| Hard Coating Layer | Composition of Reaction Gas (Vol %) | | | | | | | | | Reaction Conditions | |
|---|---|---|---|---|---|---|---|---|---|---|---|
| | $AlCl_3$ | NO | $NO_2$ | $N_2O$ | $TiCl_4$ | $N_2$ | $AlCl_3/TiCl_4$ | Ar | He | Pressure (torr) | Temperature (°C.) |
| $Al_2O_3$(a) | 0.5 | 2 | — | — | 0.01 | 7 | 50 | Remainder | — | 50 | 930 |
| $Al_2O_3$(b) | 2 | 5 | — | — | 0.05 | 7 | 40 | Remainder | — | 50 | 930 |
| $Al_2O_3$(c) | 5 | 10 | — | — | 0.3 | 7 | 17 | Remainder | — | 50 | 930 |
| $Al_2O_3$(d) | 7 | 15 | — | — | 0.3 | 7 | 23 | Remainder | — | 50 | 930 |
| $Al_2O_3$(e) | 10 | 25 | — | — | 1 | 7 | 10 | Remainder | — | 50 | 930 |
| $Al_2O_3$(f) | 3 | 5 | — | — | 0.03 | 5 | 100 | Remainder | — | 50 | 930 |
| $Al_2O_3$(g) | 3 | 20 | — | — | 0.03 | 5 | 100 | Remainder | — | 50 | 930 |
| $Al_2O_3$(h) | 3 | — | 1 | — | 0.03 | 5 | 100 | Remainder | — | 50 | 930 |
| $Al_2O_3$(i) | 3 | — | — | 30 | 0.1 | 5 | 30 | — | Remainder | 50 | 960 |
| $Al_2O_3$(j) | 3 | — | — | 20 | 0.1 | 1 | 30 | — | Remainder | 50 | 960 |
| $Al_2O_3$(k) | 3 | — | — | 20 | 0.1 | 10 | 30 | — | Remainder | 50 | 960 |
| $Al_2O_3$(l) | 3 | — | — | 20 | 0.1 | 15 | 30 | — | Remainder | 50 | 960 |
| $Al_2O_3$(m) | $AlCl_3$: 5%, $CO_2$: 12%, $H_2$: Remainder | | | | | | | | | 100 | 1020 |

TABLE 19

Hard Coating Layer (Target Layer Thickness shown in Parenthesis)

| Type | | Symbol of Substrate | First Layer | Second Layer | Third Layer | Fourth Layer | Fifth Layer | Sixth Layer |
|---|---|---|---|---|---|---|---|---|
| Method of | 46 | A | TiN (0.3) | l-TiCN (9) | TiCNO (0.2) | $Al_2O_3$ (a)(3) | TiN (0.2) | — |
| Present | 47 | A | p-TiCN (9) | $Al_2O_3$ (b)(3) | TiN (0.2) | — | — | — |
| Invention | 48 | A | TiN (0.3) | l-TiCN (5) | TiC (3) | p-TiCN (0.2) | $Al_2O_3$ (c)(3) | TiN (0.2) |
| | 49 | B | TiC (5) | TiCO (0.1) | $Al_2O_3$ (c)(5) | — | — | — |
| | 50 | B | TiC (5) | TiNO (0.1) | $Al_2O_3$ (c)(7) | — | — | — |
| | 51 | B | p-TiCN (5) | $TiO_2$ (0.1) | $Al_2O_3$ (c)(7) | TiN (0.2) | — | — |
| | 52 | C | TiN (0.2) | l-TiCN (5) | TiC (2) | p-TiCN (0.2) | $Al_2O_3$ (d)(4) | TiN (0.2) |
| | 53 | C | TiN (0.2) | l-TiCN (5) | TiC (2) | p-TiCN (0.2) | $Al_2O_3$ (e)(6) | TiN (0.2) |
| | 54 | C | TiN (0.2) | l-TiCN (5) | TiC (2) | p-TiCN (0.2) | $Al_2O_3$ (f)(8) | TiN (0.2) |
| | 55 | D | TiN (0.2) | l-TiCN (6) | TiCNO (0.2) | $Al_2O_3$ (g)(6) | TiN (0.2) | — |
| | 56 | D | TiN (0.2) | l-TiCN (6) | TiCNO (0.2) | $Al_2O_3$ (h)(6) | — | — |
| | 57 | D | TiN (0.2) | l-TiCN (6) | TiCNO (0.2) | $Al_2O_3$ (i)(10) | TiN (0.2) | — |
| | 58 | E | TiC (1) | $Al_2O_3$ (j)(2) | TiN (0.1) | — | — | — |
| | 59 | E | TiN (0.1) | l-TiCN (1) | TiCNO (0.1) | $Al_2O_3$ (k)(2) | TiN (0.1) | — |
| | 60 | E | p-TiCN (0.3) | $Al_2O_3$ (l)(2.5) | TiN (0.2) | — | — | — |

TABLE 20

| Type | | Symbol of Substrate | Hard Coating Layer (Target Layer Thickness shown in Parenthesis) | | | | | |
|---|---|---|---|---|---|---|---|---|
| | | | First Layer | Second Layer | Third Layer | Fourth Layer | Fifth Layer | Sixth Layer |
| Conventional Method | 31 | A | TiN (0.3) | l-TiCN (9) | TiCNO (0.2) | $Al_2O_3$ (m)(3) | TiN (0.2) | — |
| | 32 | A | p-TiCN (9) | $Al_2O_3$ (m)(3) | TiN (0.2) | — | — | — |
| | 33 | B | TiN (5) | TiCO (0.1) | $Al_2O_3$ (m)(5) | — | — | — |
| | 34 | B | p-TiCN (5) | $TiO_2$ (0.1) | $Al_2O_3$ (m)(7) | TiN (0.2) | — | — |
| | 35 | C | TiN (0.2) | l-TiCN (5) | TiC (2) | p-TiCN (0.2) | $Al_2O_3$ (m)(6) | TiN (0.2) |
| | 36 | C | TiN (0.2) | l-TiCN (5) | TiC (2) | p-TiCN (0.2) | $Al_2O_3$ (m)(8) | TiN (0.2) |
| | 37 | D | TiN (0.2) | l-TiCN (6) | TiCNO (0.2) | $Al_2O_3$ (m)(6) | — | — |
| | 38 | D | TiN (0.2) | l-TiCN (6) | TiCNO (0.2) | $Al_2O_3$ (m)(10) | TiN (0.2) | — |
| | 39 | E | TiN (0.1) | l-TiCN (1) | TiCNO (0.1) | $Al_2O_3$ (m)(2) | TiN (0.1) | — |
| | 40 | E | p-TiCN (0.3) | $Al_2O_3$ (m)(2.5) | TiN (0.2) | — | — | — |

TABLE 21

| Type | | $Al_2O_3$ Layer (Layer Thickness of Each Portion: μm) | | | Wear of Flank Face (mm) |
|---|---|---|---|---|---|
| | | Flank Face | Cutting Edge | Rake Face | |
| Hard-Material-Coated Cemented Carbide Cutting Tool of Present Invention | 46 | 3.0 | 3.5 | 2.8 | 0.27 |
| | 47 | 3.0 | 3.4 | 2.9 | 0.20 |
| | 48 | 3.0 | 3.4 | 2.9 | 0.22 |
| | 49 | 5.1 | 5.7 | 4.8 | 0.29 |
| | 50 | 7.0 | 7.9 | 6.7 | 0.28 |
| | 51 | 7.1 | 7.9 | 6.9 | 0.25 |
| | 52 | 4.0 | 4.4 | 3.9 | 0.22 |
| | 53 | 5.9 | 7.0 | 5.6 | 0.19 |
| | 54 | 7.9 | 9.1 | 7.4 | 0.24 |
| | 55 | 6.0 | 6.8 | 5.8 | 0.30 |
| | 56 | 5.9 | 7.0 | 5.7 | 0.27 |
| | 57 | 10.1 | 11.4 | 9.9 | 0.27 |
| | 58 | 2.0 | 2.2 | 1.9 | 0.21 |
| | 59 | 2.0 | 2.2 | 2.0 | 0.24 |
| | 60 | 2.5 | 2.9 | 2.3 | 0.22 |

TABLE 22

| Type | | $Al_2O_3$ Layer (Layer Thickness of Each Portion: μm) | | | Wear of Flank Face (mm) |
|---|---|---|---|---|---|
| | | Flank Face | Cutting Edge | Rake Face | |
| Conventional Hard-Material-Coated Cement Carbide Cutting Tool | 31 | 3.0 | 4.7 | 1.3 | Usable Life Finished in 3.5 min. |
| | 32 | 2.9 | 5.0 | 1.6 | Usable Life Finished in 2.5 min. |
| | 33 | 5.0 | 9.1 | 2.6 | Usable Life Finished in 2.0 min. |
| | 34 | 6.9 | 12.0 | 3.8 | Usable Life Finished in 3.5 min. |
| | 35 | 6.0 | 11.1 | 2.9 | Usable Life Finished in 6.0 min. |
| | 36 | 7.8 | 13.7 | 3.7 | Usable Life Finished in 6.0 min. |
| | 37 | 5.9 | 10.4 | 2.7 | Usable Life Finished in 2.0 min. |
| | 38 | 9.6 | 16.6 | 5.0 | Usable Life Finished in 2.5 min. |
| | 39 | 2.0 | 3.3 | 1.2 | Usable Life Finished in 7.5 min. |
| | 40 | 2.5 | 4.2 | 1.2 | Usable Life Finished in 9.0 min. |

(Usable life is finished due to chipping.)

TABLE 23

Hard Coating Layer Forming Conditions

| Hard Coating Layer | Composition of Reaction Gas (Vol %) | | | | | | | Reaction Conditions | |
|---|---|---|---|---|---|---|---|---|---|
| | AlCl$_3$ | NO | NO$_2$ | N$_2$O | H$_2$ | Ar | He | Pressure (torr) | Tempera-ture (°C.) |
| Al$_2$O$_3$(a) | 0.5 | 10 | — | — | 5 | Remainder | — | 50 | 1030 |
| Al$_2$O$_3$(b) | 2 | 10 | — | — | 5 | Remainder | — | 50 | 1030 |
| Al$_2$O$_3$(c) | 5 | 10 | — | — | 5 | Remainder | — | 50 | 1030 |
| Al$_2$O$_3$(d) | 7 | 10 | — | — | 5 | Remainder | — | 50 | 1030 |
| Al$_2$O$_3$(e) | 10 | 10 | — | — | 5 | Remainder | — | 50 | 1030 |
| Al$_2$O$_3$(f) | 3 | — | 1 | — | 3 | Remainder | — | 50 | 1030 |
| Al$_2$O$_3$(g) | 3 | 5 | — | — | 3 | Remainder | — | 50 | 1030 |
| Al$_2$O$_3$(h) | 3 | — | — | 20 | 3 | Remainder | — | 50 | 1030 |
| Al$_2$O$_3$(i) | 3 | — | — | 30 | 3 | Remainder | — | 50 | 1030 |
| Al$_2$O$_3$(j) | 5 | — | — | 20 | 0.5 | — | Remainder | 50 | 1030 |
| Al$_2$O$_3$(k) | 5 | — | — | 20 | 1 | — | Remainder | 50 | 1030 |
| Al$_2$O$_3$(l) | 5 | — | — | 20 | 10 | — | Remainder | 50 | 1030 |
| Al$_2$O$_3$(m) | 5 | — | — | 20 | 20 | — | Remainder | 50 | 1030 |
| Al$_2$O$_3$(n) | AlCl$_3$: 4%, CO$_2$: 12%, H$_2$: Remainder | | | | | | | 50 | 1000 |

TABLE 24

| | | Symbol of | Hard coating Layer (Target Layer Thickness shown in Parenthesis) | | | | |
|---|---|---|---|---|---|---|---|
| Type | | Substrate | First Layer | Second Layer | Third Layer | Fourth Layer | Fifth Layer |
| Method of Present Invention | 61 | A | TiN (0.3) | 1-TiCN (5) | TiCO (0.3) | Al$_2$O$_3$ (a)(4) | TiN (0.3) |
| | 62 | A | TiN (0.3) | 1-TiCN (5) | TiCO (0.3) | Al$_2$O$_3$ (b)(7) | TiN (0.3) |
| | 63 | A | TiN (0.3) | 1-TiCN (5) | TiCO (0.3) | Al$_2$O$_3$ (c)(10) | TiN (0.3) |
| | 64 | B | TiC (6) | TiCO (0.3) | Al$_2$O$_3$ (c)(3) | TiN (0.3) | — |
| | 65 | B | TiC (6) | TiCO (0.3) | Al$_2$O$_3$ (c)(5) | TiN (0.3) | — |
| | 66 | B | TiC (6) | TiCO (0.3) | Al$_2$O$_3$ (d)(7) | TiN (0.3) | — |
| | 67 | C | p-TiCN (6) | TiCO (0.3) | Al$_2$O$_3$ (e)(3) | TiN (0.3) | — |
| | 68 | C | p-TiCN (6) | TiCO (0.3) | Al$_2$O$_3$ (f)(5) | TiN (0.3) | — |
| | 69 | C | p-TiCN (6) | TiCO (0.3) | Al$_2$O$_3$ (g)(7) | TiN (0.3) | — |
| | 70 | D | TiN (0.3) | 1-TiCN (5) | TiCO (0.3) | Al$_2$O$_3$ (h)(10) | TiN (0.3) |
| | 71 | D | TiN (0.3) | 1-TiCN (5) | TiCO (0.3) | Al$_2$O$_3$ (i)(12) | TiN (0.3) |
| | 72 | D | TiN (0.3) | 1-TiCN (5) | TiCO (0.3) | Al$_2$O$_3$ (j)(15) | TiN (0.3) |
| | 73 | E | TiC (2) | TiCNO (0.3) | Al$_2$O$_3$ (k)(1.5) | TiN (0.3) | — |
| | 74 | E | p-TiCN (2) | TiNO (0.3) | Al$_2$O$_3$ (l)(1.5) | TiN (0.3) | — |
| | 75 | E | TiN (2) | TiO$_2$ (0.2) | Al$_2$O$_3$ (m)(2) | — | — |

TABLE 25

| | | Symbol of | Hard Coating Layer (Target Layer Thickness shown in Parenthesis) | | | | |
|---|---|---|---|---|---|---|---|
| Type | | Substrate | First Layer | Second Layer | Third Layer | Fourth Layer | Fifth Layer |
| Conventional Method | 41 | A | TiN (0.3) | 1-TiCN (5) | TiCO (0.3) | Al$_2$O$_3$ (n)(4) | TiN (0.3) |
| | 42 | A | TiN (0.3) | 1-TiCN (5) | TiCO (0.3) | Al$_2$O$_3$ (n)(7) | TiN (0.3) |
| | 43 | B | TiC (6) | TiCO (0.3) | Al$_2$O$_3$ (n)(3) | TiN (0.3) | — |
| | 44 | B | TiC (6) | TiCO (0.3) | Al$_2$O$_3$ (n)(5) | TiN (0.3) | — |
| | 45 | C | p-TiCN (6) | TiCO (0.3) | Al$_2$O$_3$ (n)(3) | TiN (0.3) | — |
| | 46 | C | p-TiCN (6) | TiCO (0.3) | Al$_2$O$_3$ (n)(5) | TiN (0.3) | — |
| | 47 | D | TiN (0.3) | 1-TiCN (5) | TiCO (0.3) | Al$_2$O$_3$ (n)(10) | TiN (0.3) |
| | 48 | D | TiN (0.3) | 1-TiCN (5) | TiCO (0.3) | Al$_2$O$_3$ (n)(12) | TiN (0.3) |
| | 49 | E | TiC (2) | TiCNO (0.3) | Al$_2$O$_3$ (n)(1.5) | TiN (0.3) | — |
| | 50 | E | p-TiCN (2) | TiNO (0.3) | Al$_2$O$_3$ (1.5) | TiN (0.3) | — |

TABLE 26

| Type | | Al$_2$O$_3$ Layer (Layer Thickness of Each Portion: μm) | | | Wear of Flank Face (mm) |
|---|---|---|---|---|---|
| | | Flank Face | Cutting Edge | Rake Face | |
| Hard-Material-Coated Cemented Carbide Cutting Tool of Present Invention | 61 | 4.1 | 4.7 | 3.7 | 0.25 |
| | 62 | 7.2 | 8.0 | 6.5 | 0.25 |
| | 63 | 10.1 | 11.2 | 9.4 | 0.29 |
| | 64 | 3.0 | 3.4 | 2.8 | 0.28 |
| | 65 | 4.8 | 5.7 | 4.6 | 0.27 |
| | 66 | 6.9 | 8.2 | 6.5 | 0.32 |
| | 67 | 2.9 | 3.3 | 2.8 | 0.30 |
| | 68 | 5.0 | 5.7 | 4.4 | 0.31 |
| | 69 | 7.0 | 8.1 | 6.1 | 0.35 |
| | 70 | 10.2 | 11.4 | 9.0 | 0.22 |
| | 71 | 12.1 | 13.6 | 11.0 | 0.24 |
| | 72 | 14.6 | 17.0 | 13.2 | 0.25 |
| | 73 | 1.5 | 1.7 | 1.4 | 0.20 |
| | 74 | 1.4 | 1.7 | 1.4 | 0.22 |
| | 75 | 2.0 | 2.3 | 1.8 | 0.28 |

TABLE 27

| Type | | Al$_2$O$_3$ Layer (Layer Thickness of Each Portion: μm) | | | Wear of Flank Face (mm) |
|---|---|---|---|---|---|
| | | Flank Face | Cutting Edge | Rake Face | |
| Conventional Hard-Material-Coated Cement Carbide Cutting Tool | 41 | 4.2 | 7.6 | 2.0 | Usable Life Finished in 5.0 min. |
| | 42 | 6.8 | 11.0 | 3.1 | Usable Life Finished in 5.5 min. |
| | 43 | 2.9 | 5.2 | 1.4 | Usable Life Finished in 7.5 min. |
| | 44 | 5.0 | 8.9 | 2.2 | Usable Life Finished in 6.0 min. |
| | 45 | 2.9 | 4.7 | 1.6 | Usable Life Finished in 4.0 min. |
| | 46 | 4.9 | 8.1 | 2.7 | Usable Life Finished in 2.5 min. |
| | 47 | 9.7 | 17.1 | 4.0 | Usable Life Finished in 7.5 min. |
| | 48 | 11.6 | 19.7 | 4.5 | Usable Life Finished in 5.5 min. |
| | 49 | 1.5 | 2.4 | 0.8 | Usable Life Finished in 5.0 min. |
| | 50 | 1.5 | 2.6 | 0.8 | Usable Life Finished in 6.0 min. |

(Usable life is finished due to chipping.)

TABLE 28

| Hard Coating Layer | Hard Coating Layer Forming Conditions | | | | | | | |
|---|---|---|---|---|---|---|---|---|
| | Composition of Reaction Gas (Vol %) | | | | | | Reaction Conditions | |
| | AlCl$_3$ | NO | NO$_2$ | N$_2$O | Ar | He | Pressure (torr) | Temperature (°C.) |
| Al$_2$O$_3$(a) | 0.5 | 10 | — | — | Remainder | — | 50 | 1050 |
| Al$_2$O$_3$(b) | 2 | 10 | — | — | Remainder | — | 50 | 1050 |
| Al$_2$O$_3$(c) | 5 | 10 | — | — | Remainder | — | 50 | 1050 |
| Al$_2$O$_3$(d) | 7 | 10 | — | — | Remainder | — | 50 | 1050 |
| Al$_2$O$_3$(e) | 10 | 10 | — | — | Remainder | — | 50 | 1050 |
| Al$_2$O$_3$(f) | 1 | — | 1 | — | — | Remainder | 100 | 1050 |
| Al$_2$O$_3$(g) | 1 | 5 | — | — | — | Remainder | 100 | 1050 |
| Al$_2$O$_3$(h) | 5 | — | — | 15 | — | Remainder | 50 | 1050 |
| Al$_2$O$_3$(i) | 5 | — | — | 30 | — | Remainder | 50 | 1050 |
| Al$_2$O$_3$(j) | AlCl$_3$: 4%, CO$_2$: 12%, H$_2$: Remainder | | | | | | 50 | 1000 |

TABLE 29

| Type | Symbol of Substrate | Hard Coating Layer (Target Layer Thickness shown in Parenthesis) | | | | | |
|---|---|---|---|---|---|---|---|
| | | First Layer | Second Layer | Third Layer | Fourth Layer | Fifth Layer | Sixth Layer |
| Method of Present Invention | 76 A | TiN (0.5) | 1-TiCN (8) | TiCO (0.4) | Al$_2$O$_3$ (a)(5) | TiN (0.3) | — |
| | 77 A | p-TiCN (5) | TiC (3) | TiO$_2$ (0.2) | Al$_2$O$_3$ (b)(5) | TiN (0.3) | — |
| | 78 B | p-TiCN (8) | TiCO (0.4) | Al$_2$O$_3$ (c)(7) | TiN (0.3) | — | — |
| | 79 B | TiN (0.5) | 1-TiCN (5) | TiC (3) | TiCO (0.2) | Al$_2$O$_3$ (c)(7) | TiN (0.3) |
| | 80 C | p-TiCN (5) | TiC (3) | TiCO (0.4) | Al$_2$O$_3$ (d)(5) | TiN (0.3) | — |
| | 81 C | TiC (8) | Al$_2$O$_3$ (e)(5) | TiN (0.2) | — | — | — |
| | 82 D | TiN (0.5) | 1-TiCN (6) | TiCO (0.4) | Al$_2$O$_3$ (f)(8) | TiN (0.3) | — |
| | 83 D | TiC (8) | Al$_2$O$_3$ (g)(8) | — | — | — | — |
| | 84 E | p-TiCN (1) | TiCNO (0.2) | Al$_2$O$_3$ (h)(2) | — | — | — |
| | 85 E | TiC (1) | TiN (2) | Al$_2$O$_3$ (i)(3) | TiN (0.3) | — | — |

TABLE 30

| Type | Symbol of Substrate | Hard Coating Layer (Target Layer Thickness shown in Parenthesis) | | | | | |
|---|---|---|---|---|---|---|---|
| | | First Layer | Second Layer | Third Layer | Fourth Layer | Fifth Layer | Sixth Layer |
| Conventions 1 Method | 51 A | TiN (0.5) | 1-TiCN (8) | TiCO (0.4) | Al$_2$O$_3$ (j)(5) | TiN (0.3) | — |
| | 52 A | p-TiCN (5) | TiC (3) | TiO$_2$ (0.2) | Al$_2$O$_3$ (j)(5) | TiN (0.3) | — |
| | 53 B | p-TiCN (8) | TiCO (0.4) | Al$_2$O$_3$ (j)(7) | TiN (0.3) | — | — |
| | 54 B | TiN (0.5) | 1-TiCN (5) | TiC (3) | TiNO (0.2) | Al$_2$O$_3$ (j)(7) | TiN (0.3) |
| | 55 C | p-TiCN (5) | TiC (3) | TiCO (0.4) | Al$_2$O$_3$ (j)(5) | TiN (0.3) | — |
| | 56 C | TiC (8) | Al$_2$O$_3$ (j)(5) | TiN (0.2) | — | — | — |
| | 57 D | TiN (0.5) | 1-TiCN (6) | TiCO (0.4) | Al$_2$O$_3$ (j)(8) | TiN (0.3) | — |
| | 58 D | TiC (8) | Al$_2$O$_3$ (j)(8) | — | — | — | — |
| | 59 E | p-TiCN (1) | TiCNO (0.2) | Al$_2$O$_3$ (j)(2) | — | — | — |
| | 60 E | TiC (1) | TiN (2) | Al$_2$O$_3$ (j)(3) | TiN (0.3) | — | — |

TABLE 31

| Type | | Al$_2$O$_3$ Layer (Layer Thickness of Each Portion: μm) | | | Wear of Flank Face (mm) |
|---|---|---|---|---|---|
| | | Flank Face | Cutting Edge | Rake Face | |
| Hard-Material-Coated Cemented Carbide Cutting Tool of Present Invention | 76 | 5.1 | 5.7 | 4.5 | 0.27 |
| | 77 | 5.0 | 5.5 | 4.5 | 0.31 |
| | 78 | 7.0 | 7.7 | 6.4 | 0.24 |
| | 79 | 6.8 | 7.5 | 6.3 | 0.25 |
| | 80 | 5.0 | 5.7 | 4.4 | 0.25 |
| | 81 | 5.1 | 5.9 | 4.7 | 0.29 |
| | 82 | 8.3 | 9.5 | 7.2 | 0.30 |
| | 83 | 8.0 | 9.7 | 7.2 | 0.33 |
| | 84 | 2.0 | 2.4 | 1.9 | 0.22 |
| | 85 | 3.0 | 3.4 | 2.6 | 0.23 |

TABLE 32

| Type | | Al$_2$O$_3$ Layer (Layer Thickness of Each Portion μm) | | | Wear of Flank Face (mm) |
|---|---|---|---|---|---|
| | | Flank Face | Cutting Edge | Rake Face | |
| Conventional Hard-Material-Coated Cemented Carbide Cutting Tool | 51 | 4.9 | 8.7 | 2.4 | Usable Life Finished in 3.5 min. |
| | 52 | 4.9 | 9.5 | 2.0 | Usable Life Finished in 6.0 min. |
| | 53 | 7.0 | 15.1 | 3.1 | Usable Life Finished in 4.0 min. |
| | 54 | 7.0 | 13.7 | 2.4 | Usable Life Finished in 6.5 min. |
| | 55 | 5.0 | 8.1 | 2.1 | Usable Life Finished in 3.0 min. |
| | 56 | 4.9 | 9.4 | 2.4 | Usable Life Finished in 4.5 min. |
| | 57 | 7.9 | 17.1 | 3.4 | Usable Life Finished in 7.0 min. |
| | 58 | 8.1 | 16.6 | 4.1 | Usable Life Finished in 6.0 min. |
| | 59 | 2.1 | 3.4 | 1.2 | Usable Life Finished in 9.0 min. |
| | 60 | 3.1 | 5.1 | 1.4 | Usable Life Finished in 8.5 min. |

(Usable life is finished due to chipping.)

It is apparent from the above results that the coated cutting tools made by the method of the present invention, in which the aluminum oxide layer constituting the hard coating layers is formed using the inert gas type reaction gas, have only very small amounts of local layer thickness dispersion in the aluminum oxide layer among the hard coating layers constituting the tools, even if the layer is relatively thick and the layer thicknesses of the flank face and the rake face of a cutting portion and the cutting edge where the flank face intersects the rake face are made uniform, whereas the conventional coated cutting tools made by the conventional method using a reaction gas in hydrogen for the formation of the Al$_2$O$_3$ layer have a great amount of dispersion of the layer thicknesses in a flank face, a rake face, and a cutting edge. Thus the present coated cutting tools exhibited excellent chipping resistance in the intermittent cutting of steel and cast iron as compared with that of the conventional coated cutting tools.

As described above, according to the method of the present invention, coated cutting tools in which the aluminum oxide layer constituting the hard coating layer has an increased thickness, give a very small amount of local dispersion in the layer thickness. Consequently, the above aluminum oxide layer of the present invention coated cutting tools has the same characteristics as those of the $Al_2O_3$ layer. Additionally, the present tools exhibit excellent chipping resistance not only in continuous cutting but also in intermittent cutting of metals, such as steel and cast iron, and achieve an excellent cutting performance over extended periods of time. Therefore, the present invention provides a useful industrial advantage by contributing to automatic cutting operation and labor cost saving in factories.

This application is based on Japanese Patent Applications 08-002292 (filed Jan. 10, 1996); 08-068114 (filed Mar. 25, 1996); 08-091025 (filed Apr. 12, 1996); 08-092423 (filed Apr. 15, 1996); 08-093966 (filed Apr. 16, 1996); 08-304335 (filed Nov. 15, 1996); and 08-304336 (filed Nov. 15, 1996), all filed with the Japanese Patent Office, the entire contents of each of which are hereby incorporated by reference.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for preparing a coated cutting tool comprising:
coating a surface of a substrate with a coating layer comprising an aluminum oxide wherein the aluminum oxide layer is formed from a reaction gas comprising aluminum trichloride and nitrogen oxides selected from the group consisting of NO, $NO_2$ and $N_2O$, and mixtures thereof in an inert gas as carrier gas wherein the aluminum oxide layer contains components other than aluminum and oxygen from the reaction gas in a total amount of 15% or less.

2. The method according to claim 1, wherein the reaction gas comprises, by volume:
0.5–10% of aluminum trichloride:
1–30% of said nitrogen oxides;
0–1% of titanium tetrachloride;
0–20% of hydrogen; and
0–15% of $N_2$.

3. The method according to claim 2, wherein said reaction gas comprises titanium tetrachloride in an amount of 0.01–1 vol %.

4. The method according to claim 3, wherein said reaction gas comprises titanium tetrachloride in an amount of 0.1–0.5 vol %.

5. The method according to claim 2, wherein said reaction gas comprises $N_2$ in an amount of 1–15 vol. %.

6. The method according to claim 2, wherein said reaction gas comprises hydrogen in an amount of 0.5–20 vol %.

7. The method according to claim 6, wherein said reaction gas further comprises hydrogen in an amount of 1–10 vol%.

8. The method according to claim 2, wherein the amount of aluminum trichloride is 2–7 vol. % and the amount of said nitrogen oxides is 5–20 vol %.

9. The method according to claim 1, wherein the coating step is performed at a temperature of 850°–1150° C.

10. The method according to claim 9, wherein the coating step is performed at a pressure of 20–200 torr.

11. The method according to claim 10, wherein the pressure is 40–100 torr.

12. The method according to claim 9, wherein the temperature is 900°–1100° C.

13. The method according to claim 1, wherein the inert gas in said reaction gas is Ar gas.

14. The method according to claim 1, which additionally comprises depositing one or more layers in addition to the aluminum oxide layer, and wherein all the layers together have an average thickness of 3–20 microns.

15. The method according to claim 1, wherein the substrate is a cemented carbide.

16. The method according to claim 1, wherein the aluminum oxide layer contains components other than aluminum and oxygen from the reaction gas in a total amount of 10% or less.

17. The method according to claim 1, wherein the nitrogen oxides component is NO.

* * * * *

UNITED STATES PATENT AND TRADEMARK OFFICE
CERTIFICATE OF CORRECTION

PATENT NO. : 5,770,261
DATED: : June 23, 1998
INVENTOR(S) : Eiji NAKAMURA et al

It is certified that error appears in the above-identified patent and that said Letters patent is hereby corrected as shown below:

Column 3, line 56, "$Al_2O_3$" should read --$AlCl_3$--.

Column 6, line 36, "1 mm" should read --0.1 mm--.

Signed and Sealed this

Fourth Day of May, 1999

Attest:

Q. TODD DICKINSON

*Attesting Officer*　　*Acting Commissioner of Patents and Trademarks*